United States Patent
Aoyama et al.

(10) Patent No.: US 8,277,871 B2
(45) Date of Patent: Oct. 2, 2012

(54) EVAPORATION DONOR SUBSTRATE AND METHOD FOR MANUFACTURING LIGHT-EMITTING DEVICE

(75) Inventors: Tomoya Aoyama, Kanagawa (JP); Yosuke Sato, Kanagawa (JP); Kohei Yokoyama, Kanagawa (JP); Rena Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1009 days.

(21) Appl. No.: 12/254,944

(22) Filed: Oct. 21, 2008

(65) Prior Publication Data
US 2009/0104403 A1   Apr. 23, 2009

(30) Foreign Application Priority Data
Oct. 23, 2007   (JP) .................................. 2007-275083

(51) Int. Cl.
*B05D 5/06*   (2006.01)
(52) U.S. Cl. ........................................................ 427/64
(58) Field of Classification Search ...................... 427/64
See application file for complete search history.

(56) References Cited

U.S. PATENT DOCUMENTS

| | | | |
|---|---|---|---|
| 4,923,860 A | 5/1990 | Simons | |
| 5,851,709 A * | 12/1998 | Grande et al. | 430/7 |
| 5,937,272 A | 8/1999 | Tang | |
| 6,165,543 A | 12/2000 | Otsuki et al. | |
| 6,283,060 B1 | 9/2001 | Yamazaki et al. | |
| 6,284,307 B1 | 9/2001 | Fukuzawa et al. | |
| 6,555,284 B1 * | 4/2003 | Boroson et al. | 430/201 |
| 6,689,492 B1 | 2/2004 | Yamazaki et al. | |
| 6,703,179 B2 | 3/2004 | Tyan | |
| 6,776,847 B2 | 8/2004 | Yamazaki et al. | |
| 7,316,983 B2 | 1/2008 | Yamazaki et al. | |
| 7,674,749 B2 | 3/2010 | Kang et al. | |
| 7,932,112 B2 | 4/2011 | Yokoyama et al. | |
| 7,993,945 B2 | 8/2011 | Ikeda et al. | |
| 2004/0065902 A1 | 4/2004 | Yamazaki et al. | |
| 2005/0005848 A1 | 1/2005 | Yamazaki et al. | |
| 2005/0145326 A1 | 7/2005 | Hatwar | |
| 2006/0084006 A1 * | 4/2006 | Kang et al. | 430/199 |
| 2006/0243377 A1 | 11/2006 | Matsuo et al. | |
| 2006/0246240 A1 | 11/2006 | Matsuda et al. | |
| 2008/0081115 A1 | 4/2008 | Yamazaki et al. | |
| 2009/0075214 A1 | 3/2009 | Hirakata et al. | |
| 2009/0104835 A1 | 4/2009 | Aoyama et al. | |

FOREIGN PATENT DOCUMENTS
EP   0 913 870 A2   5/1999
(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, 2007, pp. 161-164.

*Primary Examiner* — Michael Cleveland
*Assistant Examiner* — Robert Vetere
(74) *Attorney, Agent, or Firm* — Husch Blackwell LLP

(57) ABSTRACT

To provide an evaporation donor substrate which is used for deposition by an evaporation method and which allows reduction in manufacturing cost and high uniformity of a film which is deposited. In addition, to provide a method for manufacturing a light-emitting device using the evaporation donor substrate. The evaporation donor substrate includes a reflective layer having an opening which is formed over a substrate, a heat insulating layer having a light-transmitting property which is formed over the substrate and the reflective layer, a light absorption layer which is formed over the heat insulating layer; and a material layer which is formed over the light absorption layer.

28 Claims, 15 Drawing Sheets

FOREIGN PATENT DOCUMENTS

| | | |
|---|---|---|
| EP | 1 787 822 A2 | 5/1999 |
| EP | 1 650 046 A1 | 4/2006 |
| JP | 11-237504 | 8/1999 |
| JP | 2000-256877 | 9/2000 |
| JP | 2003-313654 | 11/2003 |
| JP | 2004-103406 | 4/2004 |
| JP | 2006-123546 | 5/2006 |
| JP | 2006-309995 | 11/2006 |
| JP | 2006-344459 | 12/2006 |
| WO | WO 2005/069398 A2 | 7/2005 |

* cited by examiner

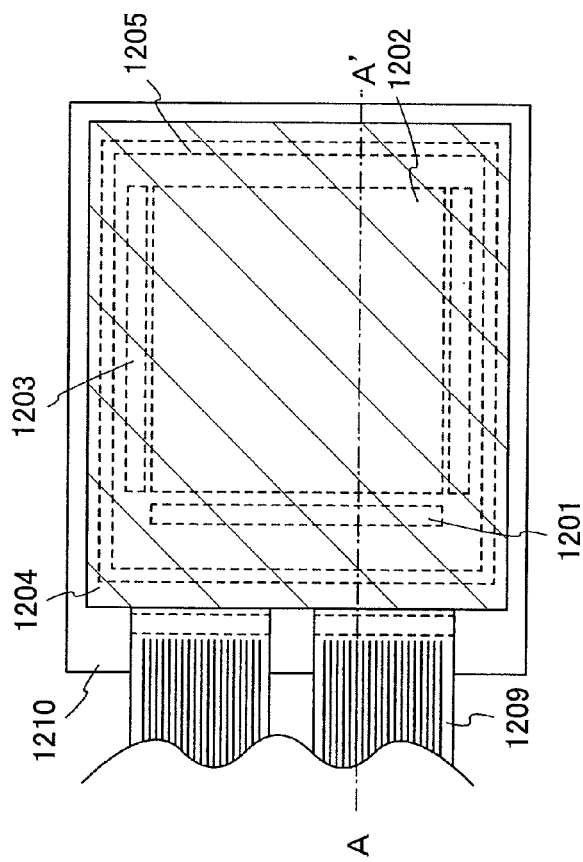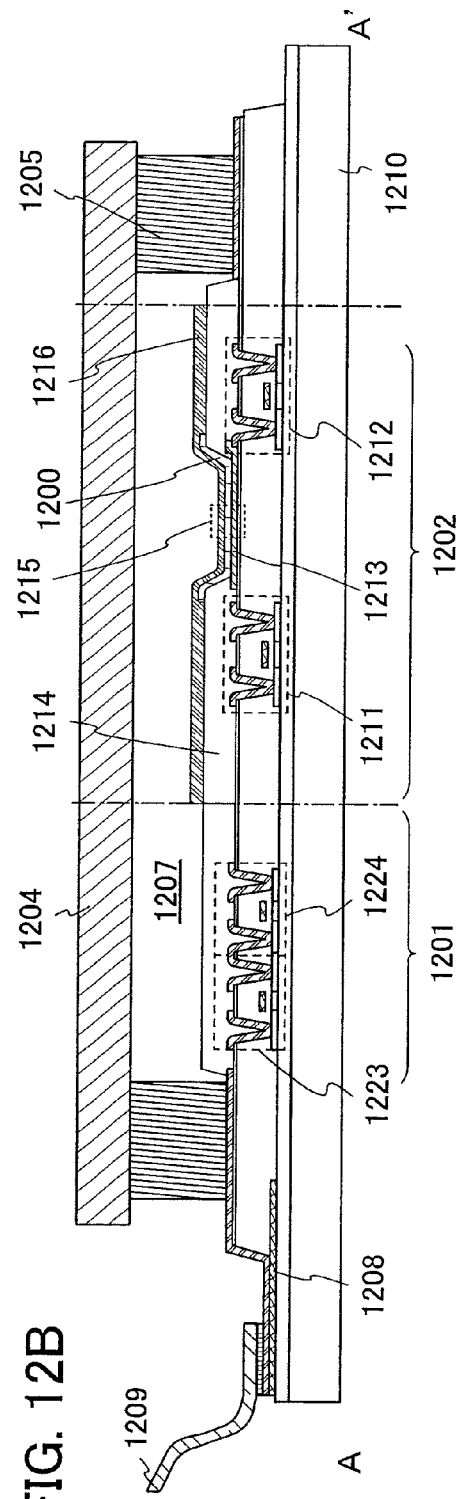
FIG. 12A
FIG. 12B

EVAPORATION DONOR SUBSTRATE AND METHOD FOR MANUFACTURING LIGHT-EMITTING DEVICE

BACKGROUND OF THE INVENTION

1. Field of the Invention

The present invention relates to evaporation donor substrates used for deposition of materials which can be deposited by an evaporation method. In addition, the present invention relates to a method for manufacturing light-emitting devices which employs the evaporation donor substrate.

2. Description of the Related Art

Light-emitting elements which use organic compounds and are characterized by thinness, lightweight, fast response, and direct current low voltage driving, are expected to be applied as a light-emitter to next-generation flat panel displays. In particular, a display device in which light-emitting elements are arranged in matrix has an advantage in a wide viewing angle and excellent visibility over a conventional liquid crystal display device.

A light emission mechanism of a light emitting element is described below: when voltage is applied between a pair of electrodes with an EL layer interposed therebetween, electrons injected from a cathode and holes injected from an anode are recombined at an emission center in the EL layer to form molecular excitons, and energy is released when the molecular excitons relax to the ground state. As excited states, a singlet excited state and a triplet excited state are known, and light emission is possible through either of these excited states.

An EL layer included in a light emitting element has at least a light emitting layer. In addition to the light emitting layer, the EL layer can have a stacked-layer structure including a hole-injecting layer, a hole-transporting layer, an electron-transporting layer, an electron-injecting layer, and/or the like.

EL materials for forming an EL layer are broadly classified into a low molecular (a monomer) material and a high molecular (a polymer) material. In general, a film of a low molecular material is often formed by an evaporation method and a film of a high molecular material is often formed by an inkjet method or the like.

An evaporation apparatus which is used in an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimed and deposited onto the substrate.

Note that in order to achieve uniform deposition, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition (bank) formed of an insulator between pixels be large. Such needs are major problems in advancing high definition (increasing the number of pixels) and miniaturization of pixel pitches along with downsize of a light-emitting device including a light-emitting element.

Therefore, as for flat panel displays, it has been necessary to solve those problems as well as to achieve high productivity and cost reduction in order to achieve higher definition and higher reliability.

Thus, a method for forming an EL layer of a light emitting element through laser thermal transfer has been proposed (see Reference 1: Japanese Published Patent Application No. 2006-309995). Reference 1 describes a transfer substrate which has a photothermal conversion layer including a low-reflective layer and a high-reflective layer and also a transfer layer over a supporting substrate. Irradiation of such a transfer substrate with laser light allows the transfer layer to be transferred to an element-forming substrate.

SUMMARY OF THE INVENTION

However, the high-reflective layer and the low-reflective layer of the transfer substrate of Reference 1 are stacked on one side of the substrate. Therefore, even with the use of the high-reflective layer, a certain degree of heat absorption is conceivable. Thus, when the energy power of laser light is large, not only a portion of the transfer layer over the low-reflective layer but also a portion of the transfer layer over the high-reflective layer may be transferred.

In a structure shown in FIG. 3 of Reference 1, no gap is allowed between the low-reflective layer and the high-reflective layer, which needs highly accurate patterning.

Further, in a structure shown in FIG. 7 of Reference 1, the low-reflective layer is patterned, the high-reflective layer is then formed over the entire surface, and the transfer layer is then formed. In this structure, heat from the low-reflective layer which is applied by absorbing laser light is transferred to the transfer layer through the high-reflective layer. Thus, not only a desired portion of the transfer layer but also the transfer layer around the desired portion may be transferred.

The present invention provides an evaporation donor substrate which is used for deposition by an evaporation method and which allows only a desired portion of an evaporation material to be evaporated so that use efficiency of the evaporation material is increased to reduce manufacturing cost, and so that a film with high uniformity to be deposited.

In addition, the present invention provides, by using such an evaporation donor substrate, a method for manufacturing a light-emitting device by which higher definition (an increase in the number of pixels) and miniaturization of pixel pitches along with downsize of the light-emitting device can be advanced.

An evaporation donor substrate according to one aspect of the present invention includes a reflective layer having an opening which is formed over a substrate, a heat insulating layer having a light-transmitting property which is formed over the substrate and the reflective layer, a light absorption layer which is formed over the heat insulating layer, and a material layer which is formed over the light absorption layer.

Note that in the foregoing structure, the reflective layer has a reflectance of 85% or more for light, preferably has a thickness of 100 nm or more, and contains any of aluminum, silver, gold, platinum, copper, an alloy containing aluminum, an alloy containing silver, or indium tin oxide.

In the foregoing structure, the heat insulating layer has a transmittance of 60% or more, and the thermal conductivity of a material which is used for the heat insulating layer is lower than the thermal conductivity of materials which are used for the reflective layer and the light absorption layer. In addition, the heat insulating layer has a thickness of 10 nm or more and 2 µm or less, and contains any of titanium oxide, silicon oxide, silicon nitride oxide, zirconium oxide, or silicon carbide.

In the foregoing structure, the light absorption layer has a reflectance of 70% or less for light, a thickness of 100 nm or more and 600 nm or less, and contains any of tantalum nitride, titanium, or carbon.

Note that in the foregoing structure, the light absorption layer may be formed into an island shape to be overlapped with an opening of the reflective layer.

Note that in the foregoing structure, the material layer contains an organic compound. Note that the present invention includes the case where the material layer contains either one or both a light-emitting material and a carrier-transporting material.

A method for manufacturing a light-emitting device according to one aspect of the present invention is a method for manufacturing a light-emitting device using the foregoing evaporation donor substrate according to the present invention. The method includes, disposing a first surface of a first substrate and a deposition target surface of a second substrate closely so that the first surface and the deposition target surface face each other, the first substrate including at least a reflective layer having an opening which is formed on the first surface, a heat insulating layer having an light-transmitting property which is in contact with the first surface and the reflective layer, a light absorption layer which is formed in contact with the heat insulating layer, and a material layer which is in contact with the light absorption layer; irradiating a second surface opposite to the first surface of the first substrate with light; selectively heating a part of the material layer which is overlapped with the opening of the reflective layer; and evaporating the part of the material layer onto the deposition target surface of the second substrate.

A method for manufacturing a light-emitting device according to one aspect of the present invention includes: disposing a first surface of a first substrate and a surface of a second substrate on which a first electrode is formed closely so that the first surface and the deposition target surface face each other, the first substrate including at least a reflective layer having an opening which is formed on the first surface, a heat insulating layer having a light-transmitting property which is in contact with the first surface and the reflective layer, a light absorption layer which is in contact with the heat insulating layer, and a material layer which is in contact with the light absorption layer; irradiating a second surface opposite to the first surface with light; selectively heating a part of the material layer which is overlapped with the opening of the reflective layer; and evaporating the part of the material layer onto a surface of the first electrode.

The present invention also covers an electronic device including a light-emitting device, as well as a light-emitting device including a light-emitting element. Accordingly, a light-emitting device in this specification refers to an image display device, a light-emitting device, and a light source (including an illumination device). In addition, the light-emitting device also refers to a module in which a light-emitting device is connected to a connector such as an flexible printed circuit (FPC), a tape automated bonding (TAB) tape, or a tape carrier package (TCP); a module in which a printed wiring board is provided on the tip of a TAB tape or a TCP; and a module in which an integrated circuit (IC) is directly mounted onto a light-emitting element by COG bonding.

By using an evaporation donor substrate according to the present invention, the thickness of the film formed onto a deposition target substrate during the deposition can be controlled by controlling the thickness of a material layer which is formed over the evaporation donor substrate. Therefore, a user does not have to adjust an evaporation speed with a thickness monitor, and the deposition process can be fully automated. Accordingly, productivity can be improved.

In addition, by using an evaporation donor substrate according to the present invention, an evaporation material contained in the material layer which is formed over the evaporation donor substrate for deposition can be uniformly sublimed. In the case where the material layer contains plural kinds of evaporation materials, a film containing the same evaporation materials at roughly the same weight ratio as the material layer can be deposited onto the deposition target substrate. Therefore, in deposition using an evaporation donor substrate according to the present invention, when deposition is performed using plural kinds of evaporation materials having different evaporation temperatures, unlike co-evaporation, the evaporation rate of each evaporation material does not have to be controlled. Thus, without complicated control of the evaporation rate or the like, a desired layer containing different kinds of evaporation materials can be deposited easily and accurately.

In addition, by a deposition method using an evaporation donor substrate of the present invention, a flat and even film can be deposited, and a minute pattern can be formed; thus, a high-definition light-emitting device can be obtained. Further, in the present invention, a lamp heater or the like with large energy power can be used as a light source. By use of a lamp heater or the like as a light source, deposition can be performed over a large area at a time; thus, a cycle time can be shortened compared with the case of, for example, using a laser device as a light source. Accordingly, manufacturing cost of a light-emitting device which is manufactured employing a deposition method using an evaporation donor substrate according to the present invention can be reduced.

By manufacturing a light-emitting device including a light-emitting element using an evaporation donor substrate according to the present invention, use efficiency of an EL material is improved, whereby manufacturing cost can be reduced. In addition, formation of an EL layer of a light-emitting element into a desired shape with high accuracy can be facilitated; accordingly, characteristics of the light-emitting device can be improved.

BRIEF DESCRIPTION OF THE DRAWINGS

FIGS. 12A and 12B illustrate an active-matrix light-emitting device.

DETAILED DESCRIPTION OF THE INVENTION

Hereinafter, embodiment modes and an embodiment of the present invention will be described in detail with reference to the drawings. Note that the present invention is not limited to the description given below, and modes and details of the present invention can be modified in various ways without departing from the spirit and scope of the present invention. Accordingly, the present invention should not be construed as being limited to the description of the embodiment modes and the embodiment given below.

Embodiment Mode 1

Embodiment Mode 1 describes an evaporation donor substrate according to the present invention and a deposition method using the evaporation donor substrate. Note that Embodiment Mode 1 describes a case where an EL layer of a light-emitting element is formed using an evaporation donor substrate.

Figure 1A:
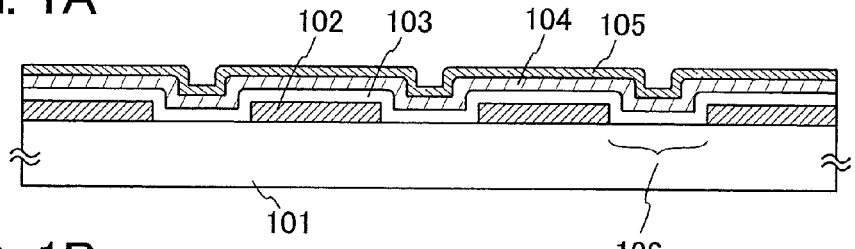
FIGS. 1A to 1D illustrate an evaporation donor substrate and a deposition method according to one aspect of the present invention.

As shown in FIG. 1A, a reflective layer 102 is formed over a first substrate 101 which is a supporting substrate. Note that the reflective layer 102 has an opening 106. A heat insulating layer 103 is formed over the reflective layer 102. Note that the heat insulating layer 103 is formed so that a part thereof fills the opening 106 of the reflective layer 102. A light absorption layer 104 is formed over the heat insulating layer 103.

Further, a material layer 105 which is formed of an evaporation material is formed over the light absorption layer 104. In FIG. 1A, the heat insulating layer 103, the light absorption layer 104, and the material layer 105 are formed over the entire surface of the first substrate 101.

Note that in the present invention, since light which is delivered to the first substrate 101 for evaporation of the evaporation material in the material layer 105 needs to be transmitted through the first substrate 101, the first substrate 101 preferably has high light transmittance. Specifically, when lamp light or laser light is used as the irradiation light, a substrate which transmits lamp light or laser light is preferably used as the first substrate 101. In addition, it is preferable that the first substrate 101 be formed of a material having low thermal conductivity. With the first substrate 101 having low thermal conductivity, heat obtained from the irradiation light can be efficiency used for evaporation. As the first substrate 101, for example, a glass substrate, a quartz substrate, a plastic substrate containing an inorganic material, or the like can be used.

The reflective layer 102 is a layer for partially reflecting the irradiation light so that a part of the light absorption layer 104 is selectively irradiated with light during evaporation. Therefore, the reflective layer 102 is preferably formed of a material having high reflectance for the irradiation light. Specifically, the reflective layer 102 preferably has a reflectance of 85% or more, more preferably, a reflectance of 90% or more for the irradiation light.

As a material for the reflective layer 102, for example, aluminum, silver, gold, platinum, copper, an alloy containing aluminum, an alloy containing silver, indium tin oxide, or the like can be used. In particular, an aluminum-titanium alloy, an aluminum-neodymium alloy, or a silver-neodymium alloy has high reflectance for light in the infrared region (a wavelength of 800 nm or more) and thus is suitably used for the reflective layer. Specifically, 400-nm thick aluminum or 400-nm aluminum-titanium alloy has a reflectance of 85% or more for light in the infrared region (a wavelength of 800 nm or more and 2500 nm or less). Note that a material like molybdenum or tungsten which is not mentioned here has low reflectance for light having a wavelength of 800 nm or more and 900 nm or less. Such a material is suitable as a material of the light absorption layer which is described later in the present invention, and is also used as a material for the reflective layer 102 in the case where the irradiation light has a wavelength 2000 nm or more and 2500 nm or less for which the material has a high reflectance of 85% or more.

Since a kind of material which is suitable for the reflective layer 102 varies depending on the wavelength of the irradiation light, the material of the reflective layer 102 needs to be selected as appropriate.

Note that the reflective layer 102 can be formed by any of a variety of methods. For example, the reflective layer 102 can be formed by a sputtering method, an electron beam evaporation method, or a vacuum evaporation method. It is preferable that the thickness of the reflective layer 102 be about 100 nm or more although it depends on a material. With a thickness of 100 nm or more, transmission of the irradiation light through the reflective layer can be suppressed.

The opening 106 can be formed in the reflective layer 102 by any of a variety of methods but is preferably formed by dry etching. By use of dry etching, the opening 106 has a sharper sidewall and a minute pattern can be formed.

The heat insulating layer 103 is a layer for preventing heat from being conducted to the light absorption layer 104 and the material layer 105, which are formed in later steps, if the irradiation light during evaporation which is reflected by the reflective layer 102 partially remains as heat in the reflective layer. Note that in order to irradiate the light absorption layer 104, which is formed over the heat insulating layer 103, with light which is transmitted through the opening 106 of the reflective layer 102; the heat insulating layer 103 needs to have a light-transmitting property. Therefore, the heat insulating layer 103 of the present invention needs to be formed using a material which has low thermal conductivity as well as high light transmittance. Specifically, the heat insulating layer 103 needs to be formed using a material which has lower thermal conductivity than materials forming the reflective layer 102 and the light absorption layer 104. In addition, the heat insulating layer 103 is preferably formed using a material which has a transmittance of 60% or more for light.

A material for the heat insulating layer 103 can be, for example, titanium oxide, silicon oxide, silicon nitride oxide, zirconium oxide, or silicon carbide.

Note that the heat insulating layer 103 can be formed by any of a variety of methods. For example, the heat insulating layer 103 can be formed by a sputtering method, an electron beam evaporation method, a vacuum evaporation method, a CVD method, or the like. It is preferable that the thickness of the heat insulating layer 103 be about 10 nm or more and 2 µm or less although it depends on a material. The thickness of the heat insulating layer 103 is more preferably 100 nm or more and 600 nm or less. With a thickness of 10 nm or more and 2 µm or less, the heat insulating layer 103 can transmit the irradiation light which is transmitted through the opening 106 of the reflective layer 102 as well as block conduction of heat in the reflective layer 102 to the light absorption layer 104 and the material layer 105. Note that while the heat insulating layer 103 is formed to cover the reflective layer 102 and the opening 106 of the reflective layer 102 in this embodiment mode, the heat insulating layer 103 may be formed only in a position which is overlapped with the reflective layer 102.

The light absorption layer 104 absorbs light which is used during evaporation. Therefore, it is preferable the light absorption layer 104 be formed of a material which has low reflectance and high absorbance for the irradiation light. Specifically, it is preferable that the light absorption layer 104 have a reflectance of 70% or less for the irradiation light.

A material for the light absorption layer 104 is preferably, for example, molybdenum, tantalum nitride, titanium, or tungsten, for light having a wavelength of 800 nm. A material for the light absorption layer 104 is preferably, for example, tantalum nitride or titanium, for light having a wavelength of 1300 nm. Note that the light absorption layer 104 is not limited to a single layer and may include a plurality of layers.

Since a kind of material which is suitable for the light absorption layer 104 varies depending on the wavelength of the irradiation light, the material of the light absorption layer 104 needs to be selected as appropriate.

Note that the light absorption layer 104 can be formed by any of a variety of methods. For example, the light absorption layer 104 can be formed by a sputtering method, an electron beam evaporation method, or a vacuum evaporation method.

It is preferable that the light absorption layer 104 have a thickness with which the irradiation light is not transmitted (the thickness of 100 nm or and 2 μm or less is preferable). In particular, with a thickness of 100 nm or more and 600 nm or less, the light absorption layer 104 can efficiently absorb the irradiation light to generate heat. In addition, the light absorption layer 104 having a thickness of 200 nm or more and 600 nm or less allows highly accurate deposition onto the deposition target substrate.

The light absorption layer 104 may partially transmit the irradiation light as long as the evaporation material contained in the material layer 105 can be heated to the sublimation temperature. Note that when the light absorption layer 104 partially transmits the irradiation light, it is preferable that a material which is not decomposed by light be used as the evaporation material contained in the material layer 105.

Note that the greater the difference in reflectance between the reflective layer 102 and the light absorption layer 104 is, the more preferable it is. Specifically, the difference in reflectance to the wavelength of the irradiation light is preferably 25% or more, more preferably, 30% or more.

The material layer 105 contains the evaporation material which is evaporated onto the deposition target substrate. Then, by irradiation of the material layer 105 with light, the evaporation material contained in the material layer 105 is heated to be sublimed and evaporated onto the deposition target substrate.

Note that any of a variety of materials can be used as the evaporation material contained in the material layer 105 regardless of whether they are organic compounds or inorganic compounds, as long as the material can be evaporated. In the case of forming an EL layer of a light-emitting element as described in this embodiment mode, a material which can be evaporated to form an EL layer is used. For example, an organic compound which forms an EL layer, such as a light-emitting material or a carrier-transporting material, or an inorganic compound which is used for an electrode or the like of a light-emitting element, such as metal oxide, metal nitride, metal halide, or an elementary substance of metal can be used. Details of the materials which can be evaporated to form an EL layer is given not here but in Embodiment Mode 5; therefore, Embodiment Mode 5 is referred to for details.

The material layer 105 may contain a plurality of materials. The material layer 105 may be a single layer or a stack of a plurality of layers. Accordingly, by stacking a plurality of layers each containing an evaporation material, co-evaporation is possible. In the case where the material layer 105 has a stacked-layer structure, it is preferable that the layers be stacked so that an evaporation material having a low sublimation temperature (or a material which can be evaporated at a lower temperature) be contained in a layer near the first substrate. Such a structure allows efficient evaporation using the material layer 105 which has a stacked-layer structure.

The material layer 105 is formed by any of a variety of methods. For example, a wet method such as a spin coating method, a spray coating method, an inkjet method, a dip coating method, a casting method, a die coating method, a roll coating method, a blade coating method, a bar coating method, a gravure coating method, or a printing method can be used. Alternatively, a dry method such as a vacuum evaporation method or a sputtering method can be used.

In order to form the material layer 105 by a wet method, a predetermined evaporation material may be dissolved or dispersed in a solvent, and a solution or a dispersion may be adjusted. There is no particular limitation on the solvent as long as an evaporation material can be dissolved or dispersed therein and the solvent does not react with the evaporation material. Examples of the solvent are as follows: halogen-based solvents such as chloroform, tetra chloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of those solvents may also be used. By using a wet method, it is possible to increase material use efficiency, which leads to a reduction in manufacturing cost.

Note that in the case where the thickness and uniformity of a film which is formed on the deposition target substrate are controlled with the material layer 105, the thickness and uniformity of the material layer 105 needs to be controlled. However, the material layer 105 does not need to be a uniform layer if the thickness and uniformity of a film which is formed on the deposition target substrate is not affected. For example, the material layer may have minute island shapes or may be a shape with projections and depressions.

Figure 1B:
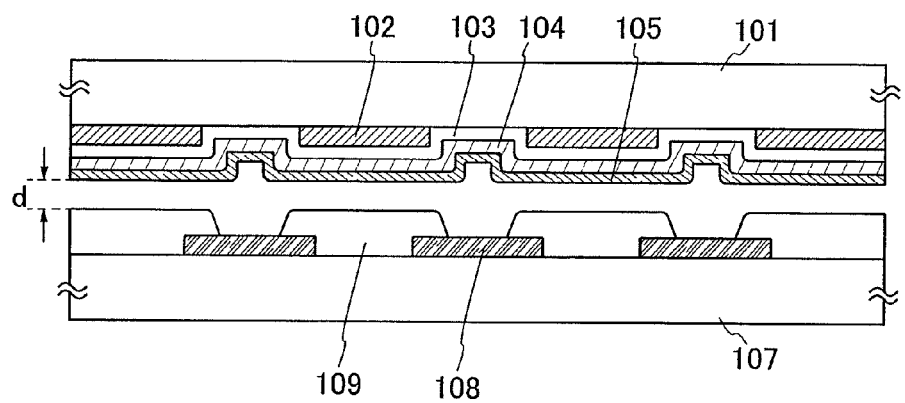

Then, as shown in FIG. 1B, a second substrate 107, which is a deposition target substrate, is disposed in position so as to face a surface of the substrate 101 which is provided with the reflective layer 102, the heat insulating layer 103, the light absorption layer 104, and the material layer 105. The second substrate 107 is a deposition target substrate onto which a desired layer is deposited by evaporation treatment. Note that since the case where an EL layer of a light-emitting element is formed using an evaporation donor substrate of the present invention is described here, a first electrode 108 which is one of electrodes of the light-emitting element and an insulator 109 are formed over the second substrate 107. Then, the first substrate 101 and the second substrate 107 are disposed so as to face each other in proximity; specifically, they are disposed close to each other so that the distance d between the surface of the material layer 105 of the first substrate 101 and the second substrate 107 is 0 mm or more and 2 mm or less, preferably 0 mm or more and 0.05 mm or less, or more preferably 0 mm or more and 0.03 mm or less.

Note that the distance d is defined as the distance between the surface of the material layer 105 of the first substrate 101 and the surface of the second substrate 107. In the case where some layer (for example, a conductive layer which functions as an electrode or an insulator which functions as a partition) is formed over the second substrate, the distance d is defined as the distance between the surface of the material layer 105 of the first substrate 101 and the outermost surface of the layer formed over the second substrate 107. When the surface of the material layer 105 of the first substrate 101 and the outermost surface of the layer over the second substrate 107 has projections and depressions, the distance d is defined as the shortest distance between the surface of the material layer 105 of the first substrate 101 and the outermost surface of the layer formed over the second substrate 107.

Figure 1C:
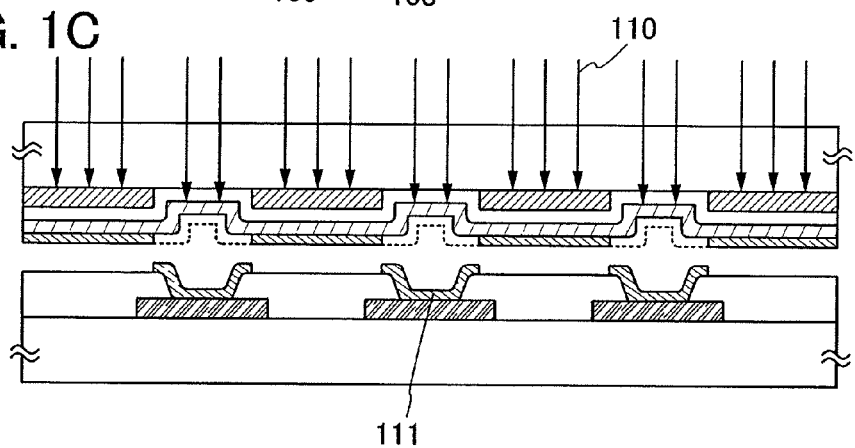

Then, as shown in FIG. 1C, a rear surface of the first substrate 101 (the surface on which the reflective layer 102, the heat insulating layer 103, the light absorption layer 104, and the material layer 105 are not formed) is irradiated with light. At this time, light 110 which is delivered to the reflective layer 102 over the first substrate 101 is reflected while light 110 which is delivered to the opening 106 of the reflective layer 102 is transmitted through the opening 106 and the heat insulating layer 103 to be absorbed by the light absorption layer 104. Then, the light absorption layer 104 absorbs light to generate heat and provides the heat to the evaporation material contained in the material layer 105 to sublime the evaporation material. Thus, the evaporation material is evaporated onto the first electrode 108 over the second substrate 107. Accordingly, an EL layer 111 of a light-emitting element is formed over the second substrate 107.

Note that it is preferable that the irradiation light be infrared light (a wavelength of 800 nm or more). The use of infrared light allows efficient thermal conversion in the light absorption layer 104, which leads to efficient sublimation of the evaporation material.

In the present invention, the material layer 105 is heated not with radiation heat from light from a light source but with the light absorption layer 104 which absorbs light from a light source. Therefore, it is preferable to set an irradiation time of light be short so that heat does not conduct from a part of the light absorption layer 104 which is irradiated with light to a part of the light absorption layer 104 which is not irradiated with light in a surface direction and so that an area of the material layer 105 which is heated is not enlarged. For example, in the case where a halogen lamp is used as the light source, the evaporation material contained in the material layer 105 can be evaporated by keeping 500° C. to 800° C. for about 7 seconds to 15 seconds.

Any of a variety of light sources can be used as a light source of the irradiation light. Examples of light sources are as follows: discharge lamps such as a xenon lamp and a metal halide lamp, and exothermic lamps such as a halogen lamp and a tungsten lamp. Further, a flash lamp using any of those light sources (e.g., a xenon flash lamp and a krypton flash lamp) can be used. A flash lamp is capable of repeatedly emitting very high-intensity light for a short time (0.1 msec to 10 msec) over a large area; thus, heating can be performed uniformly and efficiently regardless of the area of the first substrate. In addition, heating of the first substrate can also be controlled by changing time interval of light emission. Furthermore, a flash lamp has a long lifetime and consumes less power during a standby period for light emission; accordingly, it can reduce running cost.

A laser may also be used as a light source, as an alternative to a lamp. As the laser, one or more of the following can be used: a gas laser such as an Ar laser, a Kr laser, or an excimer laser; a laser of which medium is single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ which is doped with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser.

When a solid-state laser whose laser medium is solid is used, there are advantages in that a maintenance-free condition can be maintained for a long time and output power is relatively stable.

Figure 1D:
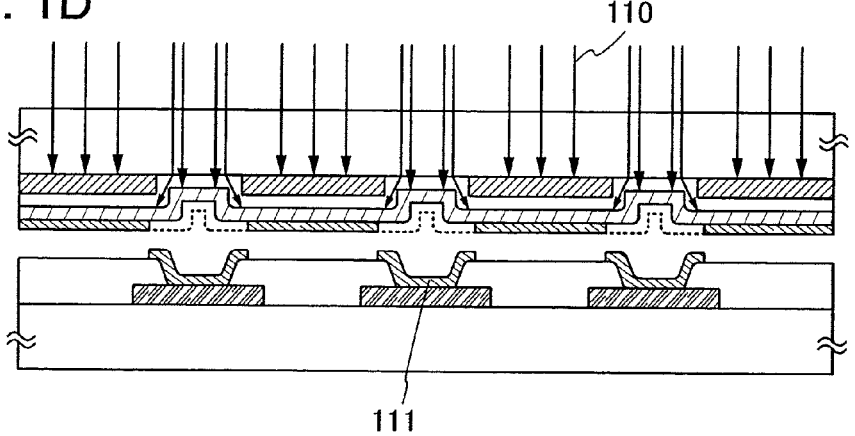

In the case where a light source of light having low directivity such as a flash lamp is employed, the light which is transmitted through the opening of the reflective layer 102 may spread; accordingly, a structure in which the opening in the reflective layer 102 is made small as in FIG. 1D in consideration of spreading of the irradiation light is effective. In FIG. 1D, since light which is transmitted through the opening 106 of the reflective layer 102 spreads before it reaches the light absorption layer 104, an area of the material layer 105 which is heated and evaporated onto the second substrate 107 is larger than a region which corresponds to the opening 106 of the reflective layer 102.

It is preferable that evaporation by light irradiation be performed in a reduced-pressure atmosphere. Accordingly, it is preferable that the deposition chamber have a pressure of $5\times10^{-3}$ Pa or less, more preferably $10^{-4}$ Pa or more and $10^{-6}$ Pa or less.

Figure 2A:
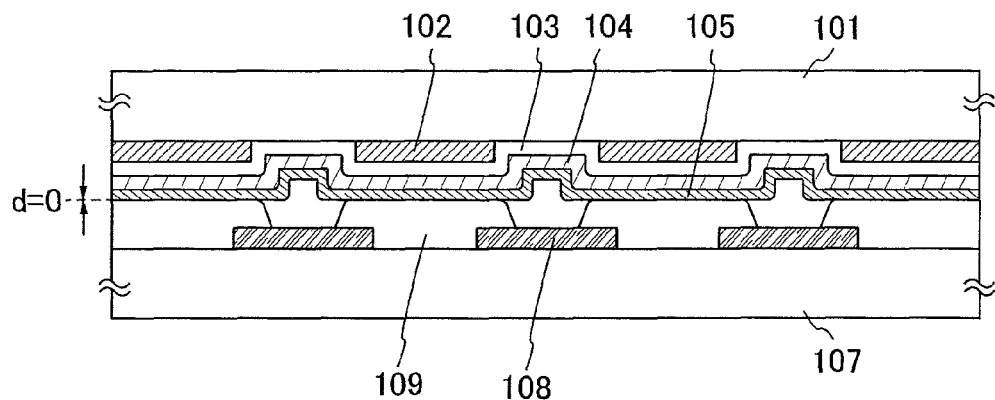
FIGS. 2A to 2C illustrate an evaporation donor substrate and a deposition method according to one aspect of the present invention.
Figure 2B:
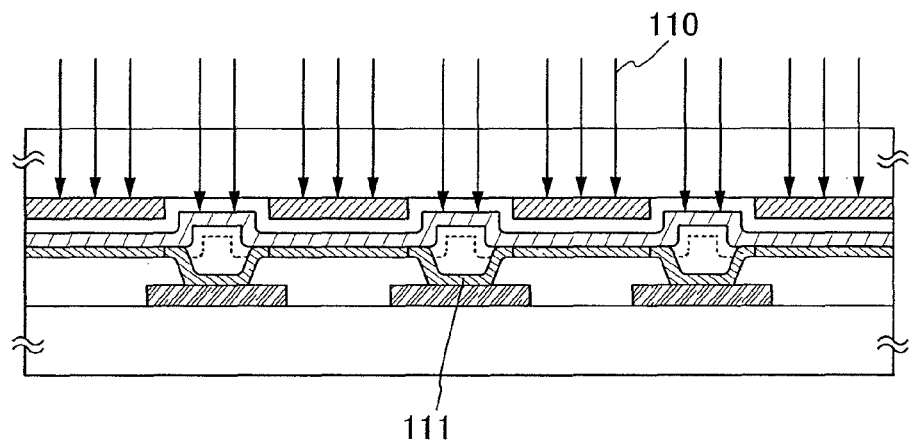

FIG. 2A shows the case where the distance d between the first substrate 101 and the second substrate 107 is 0 mm, that is, the case where the insulator 109, which is the outermost layer of layers formed over the second substrate 107 is in contact with the material layer 105 of the first substrate 101. When the distance d is reduced in this manner, excessive loss of the material is prevented, and thus material use efficiency can be improved. In addition, during irradiation with light as shown in FIG. 2B, the shape of a film which is evaporated onto the second substrate 107 can be highly accurate. Note that, in the case where the outermost surface of the deposition target substrate does not have projections and depressions, it is preferable that the material layer 105 of the first substrate 101 is not in contact with a deposition target surface of the second substrate 107.

Figure 2C:
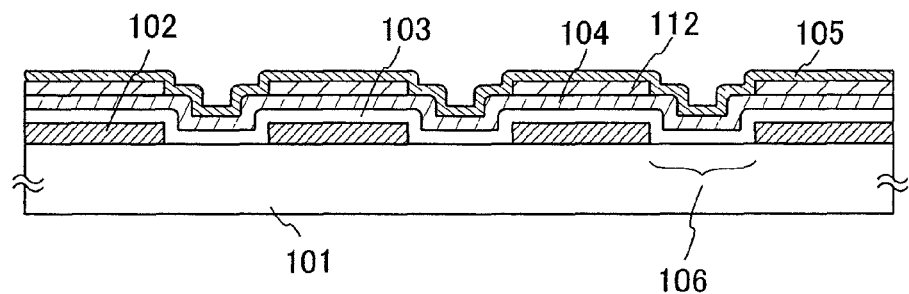

An evaporation donor substrate of the present invention may have a structure shown in FIG. 2C as an alternative to the structure shown in FIG. 1A. In the structure in FIG. 2C, a second heat insulating layer 112 is formed in positions which are overlapped with the reflective layer 102, and the reflective layer 102, the heat insulating layer 103, and the light absorption layer 104 are formed in that order over the first substrate 101. The material layer 105 is formed over the light absorption layer 104 and the second heat insulating layer 112. When such a structure is employed, the number of manufacturing steps of the evaporation donor substrate is increased compared with the case of the structure in FIG. 1A. However, such a structure can prevent deformation of a deposition pattern on the deposition target surface, deformation which is generated because heat of light irradiation for evaporation is conducted in a surface direction from a part of the light absorption layer 104 which is overlapped with the opening 106 to a part of the light absorption layer 104 which is overlapped with the reflective layer 102 and the part of the material layer 105 in a position overlapped with the reflective layer 102 is heated. In addition, by providing the second heat insulating layer 112, the distance between the light absorption layer 104, which is a heat source, and the deposition target substrate can be is kept; whereby film formation defect caused by the second substrate 107 being heated by heat from the light absorption layer 104 can be prevented. In addition, since a direction in which the material is evaporated onto the deposition target substrate from the material layer 105 can be controlled, deformation of the deposition pattern on the deposition target surface can be prevented. Note that a material and a deposition method of the second heat insulating layer 112 can be similar to a material and a deposition method of the heat insulating layer 103, but the transmittance of the material of the second heat insulating layer 112 is not particularly limited unlike the heat insulating layer 103. Note that the thickness of the second heat insulating layer 112 is preferably 1 μm to 10 μm.

Figure 3A:
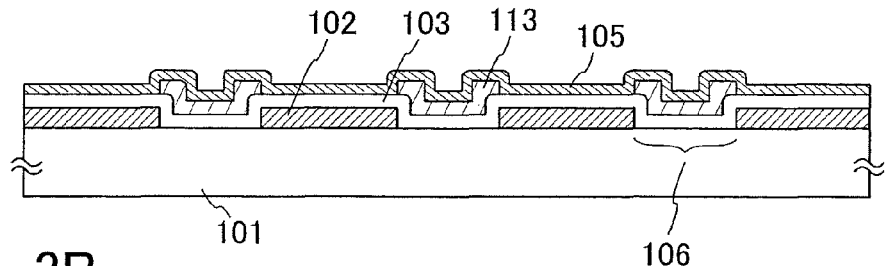
FIGS. 3A to 3D illustrate an evaporation donor substrate and a deposition method according to one aspect of the present invention.

Note that while the light absorption layer 104 is formed over the entire surface of the first substrate 101 in FIGS. 1A to 1D, the light absorption layer may be patterned into an island shape like a light absorption layer 113 in FIG. 3A. The light absorption layer 113, which is patterned into an island shape, can prevent misalignment and/or deformation of a deposition pattern on the deposition target surface, misalignment and/or deformation which is generated because heat of light irradiation for evaporation is conducted in a surface direction in the light absorption layer 104 and a part of the material layer 105 which is overlapped with the reflective layer 102 is heated.

Figure 3B:
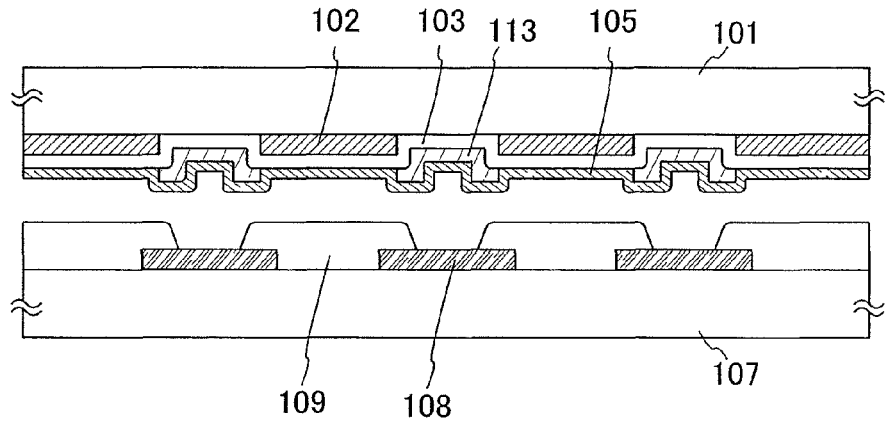

The case of the evaporation donor substrate in FIG. 3A is similar to the case of the evaporation donor substrate shown in FIGS. 1A to 1D; the second substrate 107, which is the deposition target substrate, is disposed in position to face a surface of the substrate 101 which is provided with the reflective layer 102, the heat insulating layer 103, the light absorption layer 113, and the material layer 105 as shown in FIG. 3B.

Figure 3C:
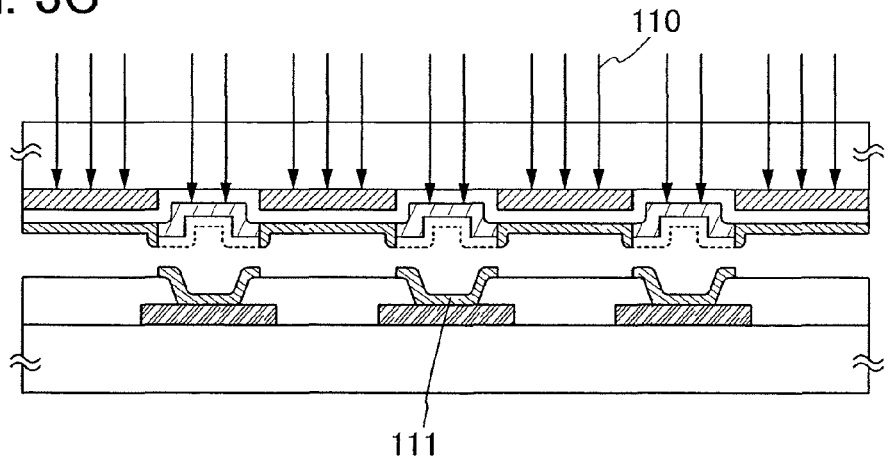

Then, as shown in FIG. 3C, a rear surface of the first substrate 101 (the surface on which the reflective layer 102, the heat insulating layer 103, the light absorption layer 113, and the material layer 105 are not formed) is irradiated with light. At this time, light 110 which is delivered to the reflective layer 102 of the first substrate 101 is reflected while light 110 which is delivered to the opening 106 of the reflective layer 102 is transmitted through the opening 106 and the heat insulating layer 103 to be absorbed by the light absorption layer 113. Then, the light absorption layer 113 which absorbs light provides heat obtained by the light to the evaporation material contained in the material layer 105 to sublime the evaporation material. Thus, the evaporation material is evaporated onto the first electrode 108 over the second substrate 107. Accordingly, an EL layer 111 of a light-emitting element is formed over the second substrate 107.

Figure 3D:
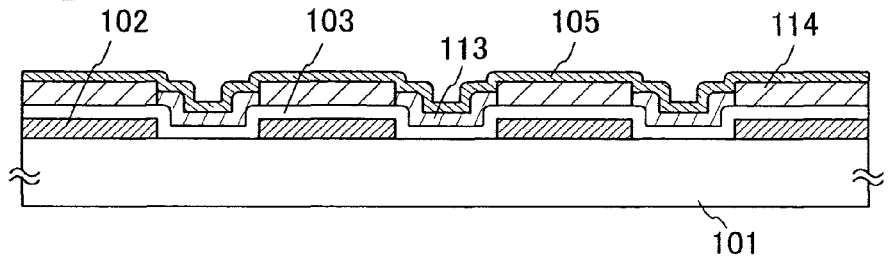

An evaporation donor substrate of the present invention may have a structure shown in FIG. 3D as an alternative to the structure shown in FIG. 3D. In the structure in FIG. 3D, a second heat insulating layer 114 is formed in positions which are overlapped with the reflective layer 102, and the reflective layer 102, the heat insulating layer 103, and the light absorption layer 104 are formed in that order over the first substrate 101. The material layer 105 is formed over the light absorption layer 104 and the second heat insulating layer 114. When such a structure is employed, the number of manufacturing steps of the evaporation donor substrate is increased compared with the case of the structure in FIG. 1A. However, by providing the second heat insulating layer 114, deformation of a deposition pattern on the deposition target surface can be prevented because a direction of the evaporation of the material which is evaporated onto the deposition target substrate from the material layer 105 can be controlled. Note that a material and a deposition method of the second heat insulating layer 114 can be similar to a material and a deposition method of the heat insulating layer 103, but the transmittance of the material of the second heat insulating layer 114 is not particularly limited unlike the heat insulating layer 103. Note that the thickness of the second heat insulating layer 114 is preferably 1 μm to 10 μm.

In this embodiment mode, the case where the second substrate 107 is positioned below the first substrate 101 is described but the present invention is not limited thereto. The orientation of the substrates can be determined as appropriate.

In a deposition method using an evaporation donor substrate of the present invention, the thickness of the film which is deposited onto the second substrate, which is a deposition target substrate, can be controlled by controlling the thickness of a material layer which is formed over the first substrate, which is an evaporation donor substrate. In other words, since the thickness of the material layer is controlled in advance so that a film which is formed over the second substrate can have a desired thickness when the whole evaporation material contained in the material layer formed over the first substrate is evaporated, a thickness monitor is not needed in deposition onto the second substrate. Therefore, a user does not have to adjust the evaporation speed with a thickness monitor, and the deposition process can be fully automated. Accordingly, productivity can be improved.

In addition, in a deposition method using an evaporation donor substrate according to the present invention, an evaporation material contained in the material layer 105 which is formed over the first substrate, which is the evaporation donor substrate, can be uniformly sublimed. In the case where the material layer 105 contains plural kinds of evaporation materials, a film containing the same evaporation materials at roughly the same weight ratio as those of the material layer 105 can be deposited onto the second substrate, which is the deposition target substrate. Therefore, in a deposition method according to the present invention, when deposition is performed using plural kinds of evaporation materials having different evaporation temperatures, unlike co-evaporation, the evaporation rate of each evaporation material does not have to be controlled. Thus, without complicated control of the evaporation rate or the like, a desired layer containing different kinds of evaporation materials can be deposited easily and accurately.

In addition, by a deposition method using an evaporation donor substrate of the present invention, a flat and even film can be deposited, and a minute pattern can be formed; thus, a high-definition light-emitting device can be obtained. Further, in the present invention, a lamp heater or the like with large energy power can be used as a light source. By use of a lamp heater or the like as a light source, deposition can be performed over a large area at a time; thus, a cycle time can be shortened compared with the case of, for example, using a laser device as a light source. Accordingly, manufacturing cost of a light-emitting device which is manufactured employing a deposition method using an evaporation donor substrate according to the present invention can be reduced.

Moreover, by a deposition method using an evaporation donor substrate of the present invention, a desired evaporation material can be deposited over the deposition target substrate without being wasted. Thus, use efficiency of an evaporation material is increased, and manufacturing cost can be reduced. Moreover, an evaporation material can be prevented from being attached to an inner wall of a deposition chamber, and thus maintenance of a deposition apparatus can be facilitated.

Embodiment Mode 2

Embodiment Mode 2 describes a method for manufacturing a light-emitting device which is capable of full-color display by forming an EL layer of a light-emitting element with a plurality of evaporation donor substrates which are described in Embodiment Mode 1.

While Embodiment Mode 1 describes the case in which an EL layer of the same kind of material is formed onto all of the plurality of electrodes over a second substrate, which is a deposition target substrate, through one deposition process, Embodiment Mode 2 describes the case in which EL layers of three different color emission are formed onto the plurality of electrodes over the second substrate.

First, three evaporation donor substrates each of which is the evaporation donor substrate in FIG. 1A in Embodiment Mode 1 are prepared. Note that a material layer containing an evaporation material for forming EL layers of a different emission color is formed in each evaporation donor substrate. Specifically, a first evaporation donor substrate having a material layer (R) for forming an EL layer exhibiting red light emission (an EL layer (R)), a second evaporation donor substrate having a material layer (G) for forming an EL layer exhibiting green light emission (an EL layer (G)), and a third evaporation donor substrate having a material layer (B) for forming an EL layer exhibiting blue light emission (an EL layer (B)) are prepared.

In addition, one deposition target substrate having a plurality of first electrodes in FIG. 1B in Embodiment Mode 1 is prepared. Note that since edges of the plurality of first electrodes are covered with an insulator 414, a light emitting region corresponds to a part of the first electrode which is exposed without being overlapped with the insulator.

First, the deposition target substrate and the first evaporation donor substrate are superimposed on each other and aligned with each other for a first deposition process. It is preferable that the deposition target substrate be provided with an alignment marker. It is preferable that the first evaporation donor substrate be also provided with an alignment marker. Note that because the first evaporation donor substrate is provided with a light absorption layer, a portion of the light absorption layer over and near the alignment marker is desirably removed in advance. In addition, because the first evaporation donor substrate is provided with the material layer (R), a portion of the material layer (R) over and near the alignment marker is also desirably removed in advance.

Then, a rear surface of the first evaporation donor substrate (the surface on which the reflective layer 102, the heat insulating layer 103, the light absorption layer 104, and the material layer 105, which are shown in FIGS. 1A to 1D, are not formed) is irradiated with light. The light absorption layer absorbs light and provides heat to the material layer (R) to sublime the evaporation material contained in the material layer (R). Thus, an EL layer (R) 411 is formed over some of the first electrodes over the deposition target substrate. After the first deposition is completed, the first evaporation donor substrate is moved away from the deposition target substrate.

Next, the deposition target substrate and the second evaporation donor substrate are superimposed on each other and aligned with each other for a second deposition process. The second evaporation donor substrate is provided with a reflective layer having an opening in a position which is shifted by one pixel from the first evaporation donor substrate, which is used in the first deposition.

Then, a rear surface of the second evaporation donor substrate (the surface on which the reflective layer 102, the heat insulating layer 103, the light absorption layer 104, and the material layer 105, which are shown in FIGS. 1A to 1D, are not formed) is irradiated with light. The light absorption layer absorbs light and provides heat to the material layer (G) to sublime the evaporation material contained in the material layer (G). Thus, an EL layer (G) 412 is formed over some of the first electrodes over the deposition target substrate which are next to the first electrodes over which the EL layer (R) is formed in the first deposition. After the second deposition is completed, the second evaporation donor substrate is moved away from the deposition target substrate.

Next, the deposition target substrate and the third evaporation donor substrate are superimposed on each other and aligned with each other for a third deposition process. The third evaporation donor substrate is provided with a reflective layer having an opening in a position which is shifted by two pixels from the first evaporation donor substrate, which is used in the first deposition.

Figure 4A:
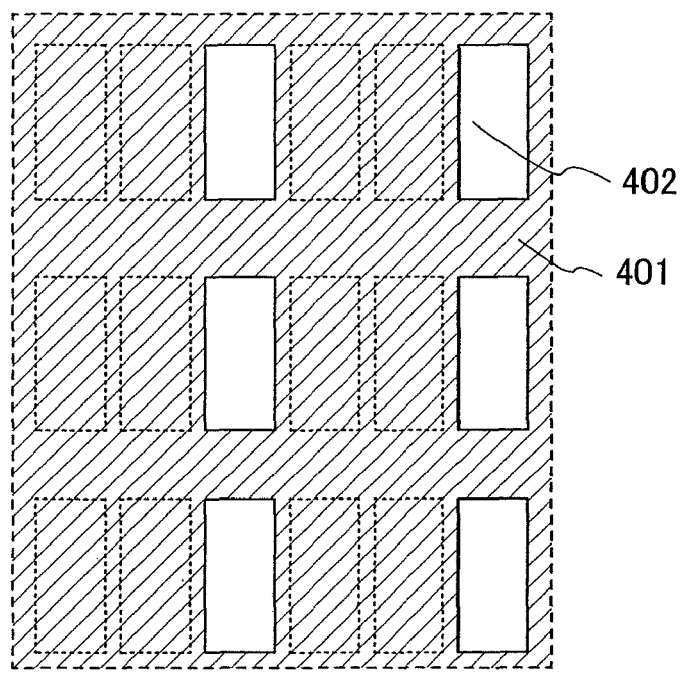
FIGS. 4A and 4B illustrate a deposition method according to one aspect of the present invention.

Then, a rear surface of the third evaporation donor substrate (the surface on which the reflective layer 102, the heat insulating layer 103, the light absorption layer 104, and the material layer 105, which are shown in FIGS. 1A to 1D, are not formed) is irradiated with light. A state of the third evaporation donor substrate right before the third deposition corresponds to the top view of FIG. 4A. In FIG. 4A, a reflective layer 401 has an opening 402. Accordingly, light which is transmitted through the opening 402 of the reflective layer 401 of the third evaporation donor substrate transmits the heat insulating layer and is absorbed by the light absorption layer. A region of the deposition target substrate which corresponds to the opening 402 of the third evaporation donor substrate is provided with the first electrode. In addition, regions of the deposition target substrate which corresponds to regions indicated by dotted lines in FIG. 4A are provided with the EL layer (R) 411 formed through the first deposition and the EL layer (G) 412 formed through the second deposition.

Then, an EL layer (B) 413 is formed through the third deposition. The light absorption layer absorbs light and provides heat to the material layer (B) to sublime the evaporation material contained in the material layer (B). Thus, the EL layer (B) 413 is formed over some of the first electrodes over the deposition target substrate which are next to the first electrodes over which the EL layer (G) 412 is formed in the second deposition. After the third deposition is completed, the third evaporation donor substrate is moved away from the deposition target substrate.

Figure 4B:
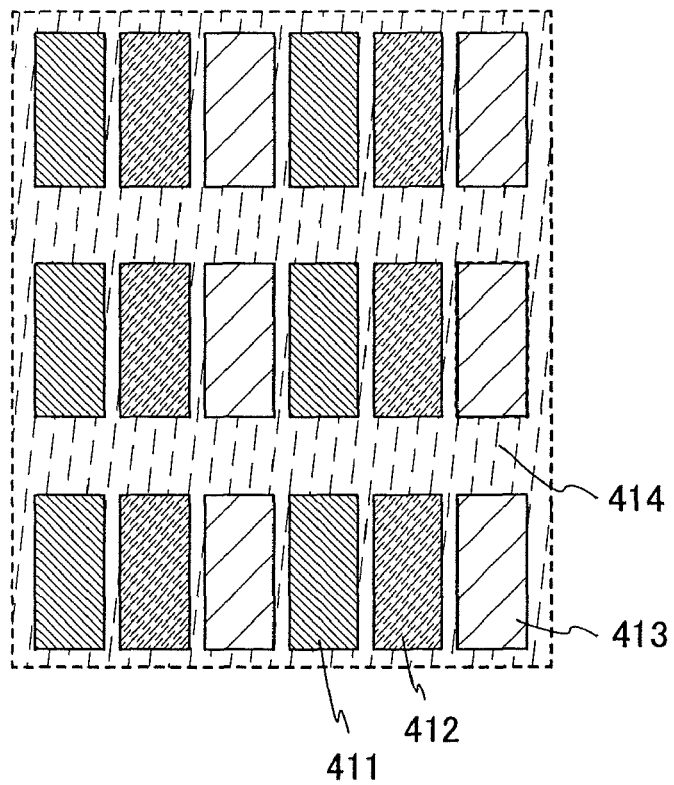

In this manner, the EL layer (R) 411, the EL layer (G) 412, and the EL layer (B) 413 can be formed at regular intervals over one deposition target substrate (FIG. 4B). Then, a second electrode is formed over these layers. Thus, light-emitting elements can be formed.

Through the above steps, light-emitting elements which exhibit light emission of different colors are formed over one substrate, whereby a light-emitting device capable of full-color display can be formed.

FIGS. 4A and 4B show the example in which the opening 402 in the reflective layer formed over the evaporation donor substrate has a rectangular shape. However, the present invention is not particularly limited to this example and stripe openings may be employed. In the case where the stripe opening portions are employed, although deposition is also performed between light-emitting regions for emitting light of the same color, the deposition between light-emitting regions is performed over the insulator 414, and thus a portion overlapping the insulator 414 does not serve as a light-emitting region.

Figure 5A:
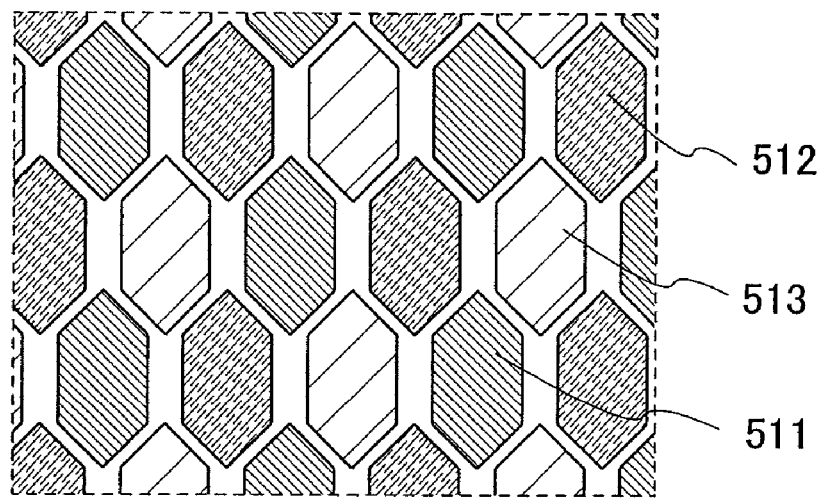
FIGS. 5A and 5B illustrate a deposition method according to one aspect of the present invention.
Figure 5B:
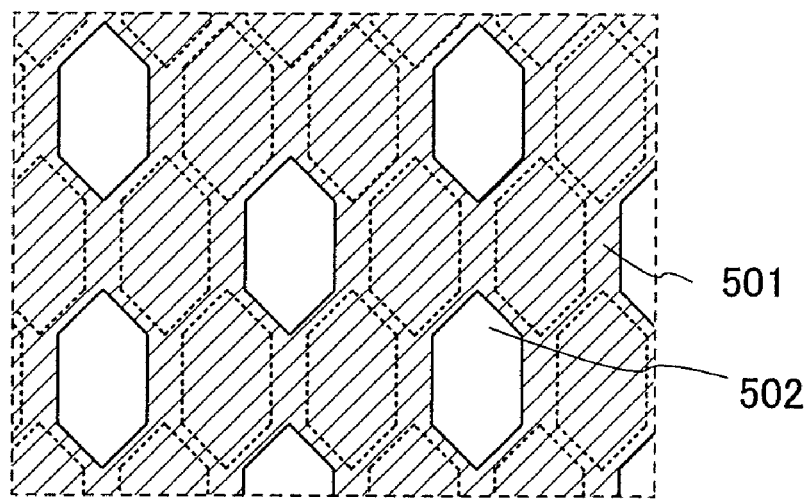

Similarly, there is no particular limitation on the arrangement of the pixels. The shape of each pixel may be a polygon, for example, a hexagon as shown in FIG. 5A, and a full-color light-emitting device may be realized by arrangement of the EL layer (R) 511, the EL layer (G) 512, and the EL layer (B) 513. In order to form polygonal pixels in FIG. 5A, deposition may be performed using an evaporation donor substrate which includes a reflective layer 501 having polygonal openings 502, and polygonal light absorption layers as shown in FIG. 5B.

In manufacture of a light-emitting device capable of full-color display which is described in Embodiment Mode 2, the thickness of the film which is deposited onto the deposition target substrate can be controlled by controlling the thickness of a material layer which is formed over the evaporation donor substrate. In other words, since the thickness of the material layer is controlled in advance so that a film which is formed over the deposition target substrate can have a desired thickness when all the evaporation material contained in the material layer which is formed over the evaporation donor substrate is evaporated, a thickness monitor is not needed in deposition onto the second substrate. Therefore, a user does not have to adjust the evaporation speed with a thickness monitor, and the deposition process can be fully automated. Accordingly, productivity can be improved.

In addition, in manufacture of a light-emitting device capable of full-color display which is described in Embodiment Mode 2, by using an evaporation donor substrate of the present invention, an evaporation material contained in the material layer which is over the evaporation donor substrate can be uniformly sublimed. In the case where the material layer contains plural kinds of evaporation materials, a film containing the same evaporation materials at roughly the same weight ratio as those of the material layer can be deposited onto the deposition target substrate. Therefore, in a deposition method according to the present invention, if deposition is performed using plural kinds of evaporation materials having different evaporation temperatures, a desired layer containing different kinds of evaporation materials can be deposited easily and accurately without complicated control of the evaporation rate or the like.

In addition, in manufacture of a light-emitting device capable of full-color display which is described in Embodiment Mode 2, by using an evaporation donor substrate of the present invention, a flat and even film can be deposited, and a minute pattern can be formed; thus, a high-definition light-emitting device can be obtained. Further, in the present invention, a lamp heater or the like with large energy power can be used as a light source. By use of a lamp heater or the like as a light source, deposition can be performed over a large area at a time; thus, a cycle time can be shortened compared with the case of, for example, using a laser device as a light source. Accordingly, manufacturing cost of a light-emitting device which is manufactured employing a deposition method using an evaporation donor substrate according to the present invention can be reduced.

Moreover, in manufacture of a light-emitting device capable of full-color display which is described in Embodiment Mode 2, by using an evaporation donor substrate of the present invention, a desired evaporation material can be deposited over the deposition target substrate without being wasted. Thus, use efficiency of an evaporation material is increased, and manufacturing cost can be reduced. Moreover, an evaporation material can be prevented from being attached to an inner wall of a deposition chamber, and thus maintenance of a deposition apparatus can be facilitated.

Note that a structure in Embodiment Mode 2 can be combined with a structure in Embodiment Mode 1 as appropriate.

Embodiment Mode 3

This embodiment mode describes examples of deposition apparatuses with which the light-emitting device according to the present invention can be manufactured. FIGS. 6A and 6B and FIGS. 7A and 7B show schematic cross-sectional views of deposition apparatuses of this embodiment mode.

Figure 6A:
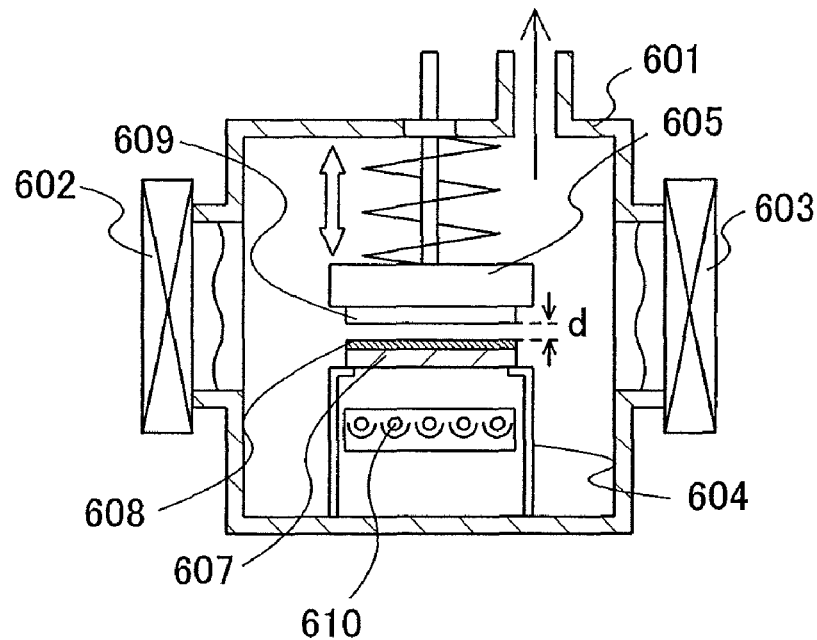
FIGS. 6A and 6B each illustrate a deposition apparatus.

In FIG. 6A, a deposition chamber 601 is a vacuum chamber and is connected to other treatment chambers via a first gate valve 602 and a second gate valve 603. The deposition chamber 601 at least includes an evaporation donor substrate supporting mechanism 604, a deposition target substrate supporting mechanism 605, and a light source 610.

First, in another deposition chamber, a material layer 608 is formed over an evaporation donor substrate 607. Here, as a supporting substrate which forms the evaporation donor substrate 607, a square plate substrate which includes copper as its main material is used. For the material layer 608, a material which can be evaporated is used. Note that there is no particular limitation on the shape of the evaporation donor substrate 607 as long as the evaporation donor substrate 607 has the same area as or a larger area than a deposition target substrate. The material layer 608 can be formed by a dry method or a wet method, and in particular, a wet method is preferable. For example, a spin coating method, a printing method, an inkjet method, or the like can be used.

The evaporation donor substrate 607 is transported to the deposition chamber 601 from the other deposition chamber and is set on the evaporation donor substrate supporting mechanism 604. A deposition target substrate 609 is fixed to the deposition target substrate supporting mechanism 605 so that a surface of the evaporation donor substrate 607 over which the material layer 608 is formed faces a deposition target surface of the deposition target substrate 609.

The deposition target substrate supporting mechanism 605 is moved so that the distance between the evaporation donor substrate 607 and the deposition target substrate 609 becomes a distance d. Note that the distance d is defined as the distance between a surface of the material layer 608 which is formed over the evaporation donor substrate 607 and a surface of the deposition target substrate 609. In addition, in the case where some layer (e.g., a conductive layer which functions as an electrode or an insulator which functions as a partition wall) is formed over the deposition target substrate 609, the distance d is defined as the distance between the surface of the material layer 608 over the evaporation donor substrate 607 and the surface of a layer formed over the deposition target substrate 609. Note that in the case where the surface of the material layer 608 over the evaporation donor substrate 607, the surface of the deposition target substrate 609, or the surface of the layer formed on the deposition target substrate 609 has projections and depressions, the distance d is defined as the shortest distance between the surface of the material layer 608 over the evaporation donor substrate 607 and the outermost surface of the deposition target substrate 609 or the layer formed on the deposition target substrate 609. Specifically, the distance d is 0 mm or more and 2 mm or less, preferably, 0 mm or more and 0.05 mm or less, or more preferably, 0 mm or more and 0.03 mm or less.

Figure 6B:
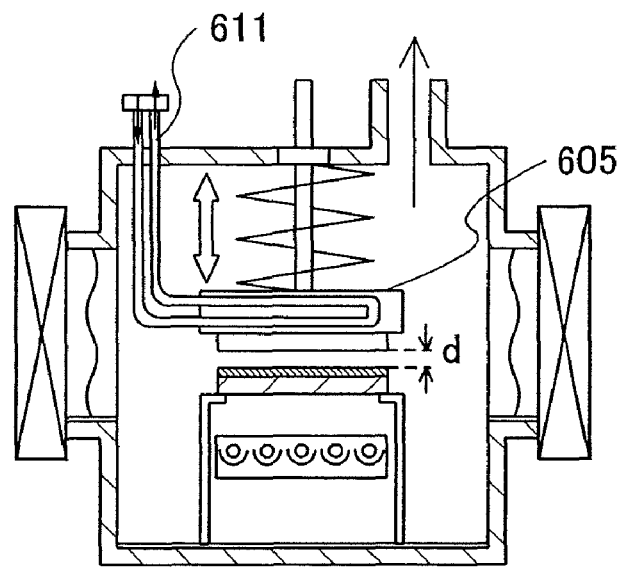

Here, the distance d is 2 mm. If the deposition target substrate 609 is hard like a quartz substrate and formed of a material which is unlikely to be deformed (flexure, warpage, or the like), the distance d can be shortened to 0 mm as the minimum distance. Although examples in which the deposition target substrate supporting mechanism 605 is moved while the evaporation donor substrate supporting mechanism 604 is fixed for controlling the distance between the substrates are shown in FIGS. 6A and 6B, a structure may also be employed in which the evaporation donor substrate supporting mechanism 604 is moved while the deposition target substrate supporting mechanism 605 is fixed. Alternatively, both the evaporation donor substrate supporting mechanism 604 and the deposition target substrate supporting mechanism 605 may be moved. Note that FIG. 6A shows a cross section of a step in which the deposition target substrate supporting mechanism 605 is moved so that the evaporation donor substrate 607 and the deposition target substrate 609 are disposed close to each other to have the distance d therebetween.

Alternatively, a structure may also be employed in which the evaporation donor substrate supporting mechanism 604 and the deposition target substrate supporting mechanism 605 are moved not only in a vertical direction but also in a horizontal direction so that precise alignment is performed. In addition, the deposition chamber 601 may include an alignment mechanism such as CCD for precise alignment or measurement of the distance d. In addition, a sensor for measuring the temperature or humidity inside the deposition chamber 601, or the like may be provided.

The evaporation donor substrate 607 is irradiated with light from the light source 610. Thus, the material layer 608 over the evaporation donor substrate 607 is heated in a short time and sublimed, whereby an evaporation material contained in the material layer 608 is deposited onto a deposition target surface (i.e., a lower surface) of the deposition target substrate 609, which is placed to face the material layer 608. In the deposition apparatus shown in FIG. 6A, if the material layer 608 with a uniform thickness is formed over the evaporation donor substrate 607 in advance, a film with a uniform thickness can be deposited onto the deposition target substrate 609 without any thickness monitor. Although a substrate is rotated in a conventional evaporation apparatus, the deposition target substrate is fixed during deposition in the deposition apparatus shown in FIG. 6A; thus, this deposition apparatus is suitable for deposition onto a large-area glass substrate which is easily broken. In addition, in the deposition apparatus in FIG. 6A, the evaporation donor substrate is also fixed during deposition.

Note that it is preferable that a large part of the light source 610 is opposite the evaporation donor substrate 607.

In order to reduce thermal effects on the material layer 608 over the evaporation donor substrate 607 by the light source on standby, an openable and closable shutter used for thermal insulation on standby (before an evaporation process) may be provided between the light source 610 and the evaporation donor substrate 607.

The light source 610 may be a heating means capable of uniform heating in a short time. For example, a lamp or a laser may be used.

In the case of using a lamp as a light source, a discharge lamp such as a xenon lamp or a metal halide lamp, an exothermic lamp such as a halogen lamp or a tungsten lamp, or the like can be used. Further, a flash lamp using any of those light sources (e.g., a xenon flash lamp and a krypton flash lamp) can be used. A flash lamp is capable of repeatedly emitting very high-intensity light for a short time (0.1 msec to 10 msec) over a large area; thus, heating can be performed uniformly and efficiently regardless of the area of the evaporation donor substrate. In addition, heating of the evaporation donor substrate 607 can also be controlled by changing time interval of light emission. Furthermore, a flash lamp has a long lifetime and consumes less power during a standby period for light emission; accordingly, it can reduce running cost. In addition, because a flash lamp facilitates rapid heating, a vertical movement mechanism, a shutter, and the like can be simplified compared with the case of using a heater. Thus, further reduction in size of the deposition apparatus can be achieved.

In the case of using a laser as a light source, one or more of the following can be used: a gas laser such as an Ar laser, a Kr laser, or an excimer laser; a laser of which medium is single-crystal YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$, which is doped with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. When a solid-state laser whose laser medium is solid is used, there are advantages in that a maintenance-free condition can be maintained for a long time and output power is relatively stable.

Although FIG. 6A shows an example in which the light source 610 is placed in the deposition chamber 601, a part of an inner wall of the deposition chamber may be made of a light-transmitting member and the light source 610 may be placed outside the deposition chamber. When the light source 610 is placed outside the deposition chamber 601, maintenance such as replacement of light bulbs of the light source 610 can be facilitated.

FIG. 6B shows an example of a deposition apparatus provided with a mechanism for controlling the temperature of the deposition target substrate 609. Components in FIG. 6B which are the same as those in FIG. 6A are denoted by the same reference numerals. In FIG. 6B, the deposition target substrate supporting mechanism 605 includes a tube 611 through which a heat medium flows. A refrigerant flows through the tube 611 as a heat medium, whereby the deposition target substrate supporting mechanism 605 can be used as a cold plate. Note that the tube 611 has a mechanism with which it can follow the vertical movement of the deposition target substrate supporting mechanism 605. As the heat medium, for example, water, silicone oil, or the like can be used. Note that, although an example in which the tube through which a refrigerant gas or a liquid refrigerant flows is used is described here, the deposition target substrate supporting mechanism 605 may be provided with a Peltier element or the like as a cooling means. Alternatively, not a cooling means but a heating means may be provided. For example, a heat medium for heating may be made to flow through the tube 611.

The deposition apparatus shown in FIG. 6B is useful in the case where different kinds of material layers are stacked. For example, in the case where a first material layer has been formed on the deposition target substrate 609, a second material layer having a higher evaporation temperature than the first material layer can be stacked on the first material layer. In FIG. 6A, because the deposition target substrate 609 and the evaporation donor substrate 607 are disposed close to each other, the first material layer which has been formed on the deposition target substrate 609 may be sublimed. When the deposition apparatus shown in FIG. 6B is used, the second material layer can be stacked on the first material layer which has been formed on the deposition target substrate 609 while sublimation of the first material layer is suppressed using a cooling mechanism.

The deposition target substrate supporting mechanism 605 may be provided with a heating means such as a heater as well as the cooling mechanism. A mechanism for controlling (heating or cooling) the temperature of the deposition target substrate 609 can prevent flexure or the like of the substrate.

Figure 7A:
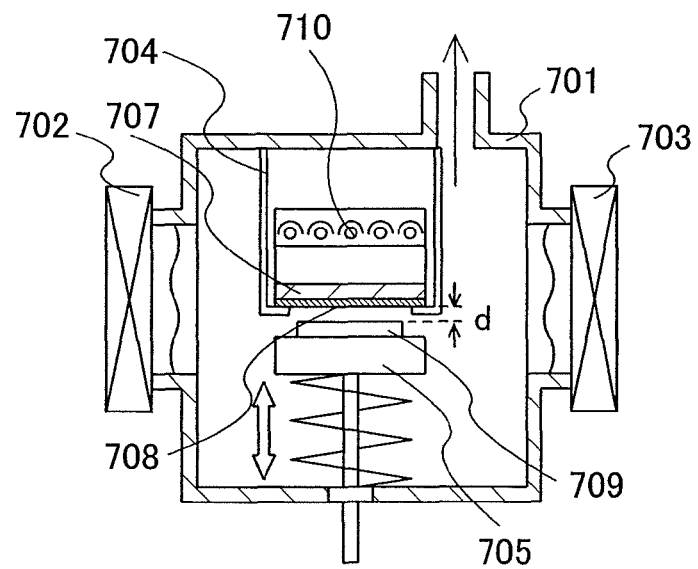
FIGS. 7A and 7B each illustrate a deposition apparatus.

Note that, although FIGS. 6A and 6B show the example of the deposition apparatus employing a face-down system in which the deposition target surface of the deposition target substrate 609 faces downward, a deposition apparatus employing a face-up system as shown in FIG. 7A may be used.

In FIG. 7A, a deposition chamber 701 is a vacuum chamber and is connected to other treatment chambers via a first gate valve 702 and a second gate valve 703. The deposition chamber 701 at least includes an evaporation donor substrate supporting mechanism 704, a deposition target substrate supporting mechanism 705, and a light source 710.

A deposition process is as follows. First, in another deposition chamber, a material layer 708 is formed over an evaporation donor substrate 707. There is no particular limitation on the shape of the evaporation donor substrate 707 as long as the evaporation donor substrate 707 has the same area as or a larger area than a deposition target substrate. The material layer 708 contains plural kinds of materials which can be evaporated and have different evaporation temperatures. The material layer 708 can be formed by a dry method or a wet method, and in particular, a wet method is preferable. For example, a spin coating method, a printing method, an ink-jet method, or the like can be used.

The evaporation donor substrate 707 is transported to the deposition chamber 701 from another deposition chamber and is set on the evaporation donor substrate supporting mechanism 704. A deposition target substrate 709 is fixed to the deposition target substrate supporting mechanism 705 so that a surface of the evaporation donor substrate 707 over which the material layer 708 is formed faces a deposition target surface of the deposition target substrate 709. As shown in FIG. 7A, this structure is an example of a face-up system in which the deposition target surface of the substrate faces upward. In the case of the face-up system, a large-area glass substrate which is easily warped placed on a flat stage, or the glass substrate is supported by a plurality of pins, whereby the substrate has no warpage, and thus a deposition apparatus can be realized with which a film of a uniform thickness can be obtained over an entire surface of the substrate.

The deposition target substrate supporting mechanism 705 is moved so that the distance between the evaporation donor substrate 707 and the deposition target substrate 709 becomes a distance d. Note that the distance d is defined as the distance between a surface of the material layer 708, which is formed over the evaporation donor substrate 707, and a surface of the deposition target substrate 709. In addition, in the case where some layer (e.g., a conductive layer which functions as an electrode or an insulator which functions as a partition wall) is formed over the deposition target substrate 709, the distance d is defined as the distance between the surface of the material layer 708 of the evaporation donor substrate 707 and the surface of a layer which is formed over the deposition target substrate 709. Note that in the case where the surface of the material layer 708 over the evaporation donor substrate 707, the surface of the deposition target substrate 709, or the surface of the layer formed on the deposition target substrate 709 has projections and depressions, the distance d is defined as the shortest distance between the surface of the material layer 708 over the evaporation donor substrate 707 and the outermost surface of the deposition target substrate 709 or the layer formed on the deposition target substrate 709. Specifically, the distance d is 0 mm or more and 2 mm or less, preferably 0 mm or more and 0.05 mm or less, or more preferably 0 mm or more and 0.03 mm or less.

Here, the distance d is 2 mm. Although the example in which the deposition target substrate supporting mechanism 705 is moved while the evaporation donor substrate supporting mechanism 704 is fixed is shown, a structure may also be employed in which the evaporation donor substrate supporting mechanism 704 is moved while the deposition target substrate supporting mechanism 705 is fixed. Alternatively, both the evaporation donor substrate supporting mechanism 704 and the deposition target substrate supporting mechanism 705 may be moved to adjust the distance d.

As shown in FIG. 7A, the evaporation donor substrate 707 is irradiated with light from the light source 710 while the distance d between the substrates is kept. Note that it is preferable that a large part of the light source 710 is opposite the evaporation donor substrate 707.

By irradiation of the evaporation donor substrate 707 with light from the light source 710, the material layer 708 of the evaporation donor substrate 707 is heated in a short time and sublimed, and thus an evaporation material is deposited onto a deposition target surface (i.e., an upper surface) of the deposition target substrate 709, which is placed to face the material layer 708. This makes it possible to drastically reduce the capacity of the chamber compared to a conventional evaporation apparatus which has a large-capacity chamber; accordingly, a small-sized deposition apparatus can be realized.

The light source 710 is not specifically limited and may be a heating means capable of uniform heating in a short time. In the case where a surface to be irradiated is large, a lamp with which the surface can be irradiated at one time is preferable to a laser. In the example shown in FIG. 7A, the light source 710 is fixed above the deposition target substrate 709 and a film is deposited on an upper surface of the deposition target substrate 709 immediately after the light source 710 emits light.

Figure 7B:
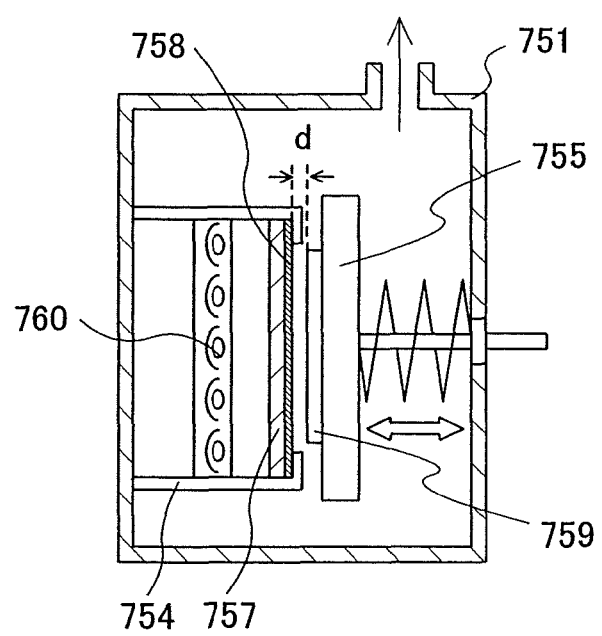

Note that, although FIGS. 6A and 6B and FIG. 7A each show the example of the deposition apparatus employing a system in which a substrate is horizontally placed, a deposition apparatus employing a system in which a substrate is vertically placed as shown in FIG. 7B can also be used.

In FIG. 7B, a deposition chamber 751 is a vacuum chamber. The deposition chamber 751 at least includes an evaporation donor substrate supporting mechanism 754, a deposition target substrate supporting mechanism 755, and a light source 760.

Although not shown, the deposition chamber 751 is connected to a first transport chamber to and from which a deposition target substrate is transported while being placed vertically. The deposition chamber 751 is also connected to a second transport chamber to and from which the deposition target substrate is transported while being placed vertically, which is also not shown. In this specification, vertical placement of a substrate refers to placement of a substrate in which a substrate surface makes a substantially right angle (ranging from 70° to 110°) with a horizontal surface. Because a large-area glass substrate or the like is easy to warped, it is desirably transported while being placed vertically. Note that a lamp is used for the light source 760.

A deposition process is as follows. First, in another deposition chamber, a material layer 758 is formed over an evaporation donor substrate 757.

The evaporation donor substrate 757 is transported to the deposition chamber 751 from another deposition chamber and is set on the evaporation donor substrate supporting mechanism 754. A deposition target substrate 759 is fixed to the deposition target substrate supporting mechanism 755 so that a surface of the evaporation donor substrate 757 which is provided with the material layer 758 faces a deposition target surface of the deposition target substrate 759.

Then, the evaporation donor substrate 757 is irradiated with light from the light source 760 while the distance d between the substrates is kept. The material layer 758 of the evaporation donor substrate 757 is heated and sublimed in a short time, and thus an evaporation material is deposited onto the deposition target surface of the deposition target substrate 709, which is placed to face the material layer 758. This makes it possible to drastically reduce the capacity of the chamber compared to a conventional evaporation apparatus which has a large-capacity chamber; accordingly, a small-sized deposition apparatus can be realized.

Note that by providing a plurality of deposition apparatuses described in this embodiment mode, a multi-chamber manufacturing apparatus can be obtained. It is needless to say that a deposition apparatus of another film formation method can be combined therewith. Furthermore, a plurality of deposition apparatuses described in this embodiment mode can be arranged in series, whereby an in-line manufacturing apparatus can be obtained.

By using such a deposition apparatus, a light-emitting device according to the present invention can be manufactured. In the present invention, a material layer over an evaporation donor substrate which is an evaporation source can be easily prepared by a wet method. In addition, because the material layer over the evaporation donor substrate may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be facilitated.

Also in the case of manufacturing a light-emitting device using a deposition apparatus described in this embodiment mode, deposition of a flat and even film and a minute patterning of a light-emitting layer can be facilitated in forming an EL layer in a light-emitting element; thus, a high-definition light-emitting device can be manufactured. In addition, by using a lamp heater with large energy power as a light source, deposition can be performed onto a large area at a time; accordingly, a cycle time can be shortened, which leads to a reduction in manufacturing cost.

Note that a structure in Embodiment Mode 3 can be combined with a structure in Embodiment Mode 1 or Embodiment Mode 2 as appropriate.

Embodiment Mode 4

Embodiment Mode 4 describes an example of a deposition apparatus which performs evaporation by irradiating an evaporation donor substrate of the present invention with laser light.

Figure 8:
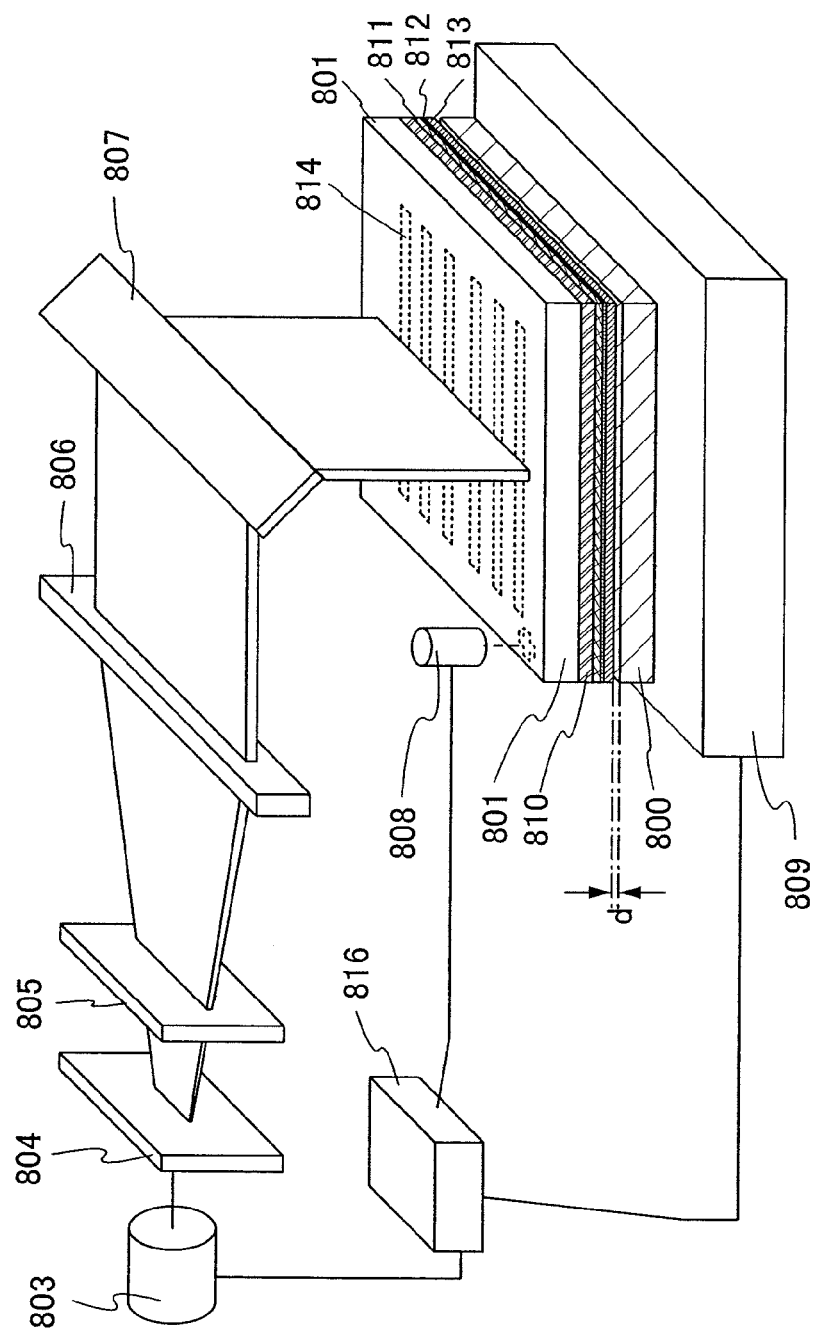
FIG. 8 illustrates a deposition apparatus.

FIG. 8 is a perspective view showing an example of a deposition apparatus using a laser. Laser light is outputted from a laser device 803 (a YAG laser device, an excimer laser device, or the like) and transmitted through a first optical system 804 for changing a laser light shape into a rectangular shape, a second optical system 805 for shaping the laser light, and a third optical system 806 for collimating a beam; and an optical path is bent to a direction perpendicular to an evaporation donor substrate 801 by using a reflecting mirror 807. Then, the laser light is delivered to the evaporation donor substrate.

Note that the structure of the evaporation donor substrate described in Embodiment Mode 4 is similar to that described in Embodiment Mode 1. In other words, a reflective layer 810, a heat insulating layer 811, a light absorption layer 812, and a material layer 813 are formed over the substrate. In addition, the reflective layer 810 has an opening 814. In this embodiment mode, a material which can withstand irradiation with laser light is used for the reflective layer 810. Further, a heat resistant metal is desirably used for the light absorption layer 812, for example, tungsten or tantalum can be used.

The shape of a laser spot with which the evaporation donor substrate 801 is irradiated is desirably a rectangular or linear shape. Specifically, the shape may be a rectangle having a shorter side of 1 mm to 5 mm and a longer side of 10 mm to 50 mm. Furthermore, in the case of using a large-area substrate, a laser spot preferably has a longer side of 20 cm to 100 cm in order to shorten processing time. Moreover, a plurality of laser devices and optical systems shown in FIG. 8 may be provided to process a large-area substrate in a short time. Specifically, laser light may be emitted from the plurality of laser devices so that the laser light are used to process divided areas of a substrate.

Note that FIG. 8 shows an example, and there is no particular limitation on positional relationship between each optical system and electro-optical element placed in the path of laser light. For example, a reflective mirror 802 is not always needed if the laser device 803 is placed above the evaporation donor substrate 801 so that laser light is emitted from the laser device 803 in a direction perpendicular to a principle plane of the evaporation donor substrate 801. Furthermore, each optical system may be a condenser lens, a beam expander, a homogenizer, a polarizer, or the like, and these may be combined. Further, each optical system may be combined with a slit.

By appropriate two-dimensional scanning over an irradiation region with laser light, a wide area of the substrate is irradiated. The scanning is performed by relative movement between laser light irradiation region and the substrate. Here, the scanning is performed with a moving means (not shown) for moving a substrate stage 809 having the substrate in X and Y directions.

A control device 816 is preferably interlocked such that it can also control the moving means which moves the substrate stage 809 in the X and Y directions. Furthermore, the control device 816 is preferably interlocked such that it can also control the laser device 803. Moreover, the control device 816 is preferably interlocked with a positional alignment mechanism which has an imaging element 808 for recognizing a positional alignment marker.

A positional alignment mechanism aligns the evaporation donor substrate 801 and a deposition target substrate 800 with each other.

The evaporation donor substrate 801 and the deposition target substrate 800 are brought close to face each other so that the distance d therebetween is 0 mm or more and 2 mm or less, preferably 0 mm or more and 0.05 mm or less, or more preferably 0 mm or more and 0.03 mm or less. When the deposition target substrate 800 is provided with an insulator which functions as a partition wall, the insulator and the material layer 815 may be disposed in contact with each other.

When deposition is performed with use of the deposition apparatus shown in FIG. 8, at least the evaporation donor substrate 801 and the deposition target substrate 800 are disposed in a vacuum chamber. All of the components shown in FIG. 8 may be placed in a vacuum chamber.

Although FIG. 8 shows an example of the deposition apparatus employing a so-called face-up system in which the deposition target surface of the deposition target substrate 800 faces upward, a deposition apparatus employing a face-down system may be used. When the deposition target substrate 800 is a large-area substrate, an apparatus employing a so-called vertical placement may also be employed in which a principal plane of the deposition target substrate 800 is arranged substantially perpendicular to a horizontal plane in order to suppress bending of the center of the substrate due to its own weight.

When a cooling means for cooling the deposition target substrate 800 is provided, a flexible substrate such as a plastic substrate can be used as the deposition target substrate 800.

Note that by providing a plurality of manufacturing apparatuses described in this embodiment mode, a multi-chamber manufacturing apparatus can be obtained. It is needless to say that a deposition apparatus of another film formation method can be combined therewith. Furthermore, a plurality of manufacturing apparatuses described in this embodiment mode can be arranged in series, whereby an in-line manufacturing apparatus can be obtained.

By using such a deposition apparatus, a light-emitting device according to the present invention can be manufactured. In the present invention, a material layer over an evaporation donor substrate, which is an evaporation source, can be easily prepared by a wet method. In addition, because the material layer over the evaporation donor substrate may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be facilitated.

In the case of manufacturing a light-emitting device using a deposition apparatus which is described in this embodiment mode, deposition of a flat and even film and a minute patterning of a light-emitting layer in the light-emitting element can be facilitated in forming an EL layer in a light-emitting element; thus, a high-definition light-emitting device can be obtained.

Note that a structure in Embodiment Mode 4 can be combined with a structure in any of Embodiment Modes 1 to 3 as appropriate.

Embodiment Mode 5

This embodiment mode describes a method for manufacturing a light-emitting device and a light-emitting element according to the present invention.

Figure 9A:
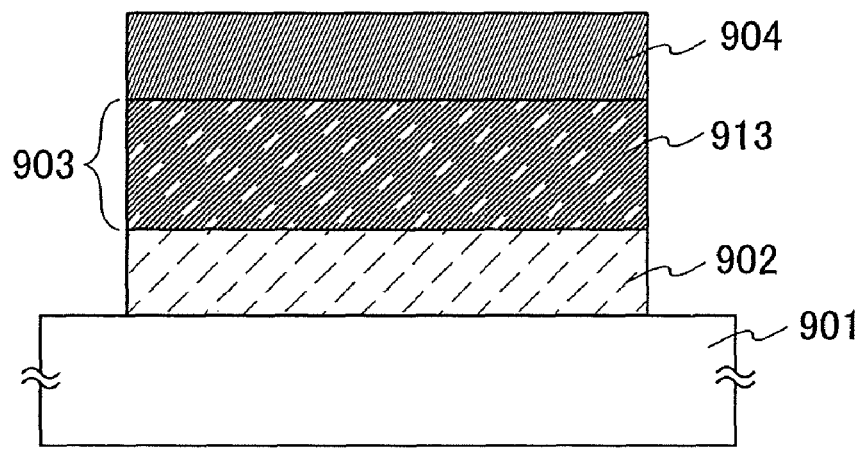
FIGS. 9A and 9B each illustrate a light-emitting element.
Figure 9B:
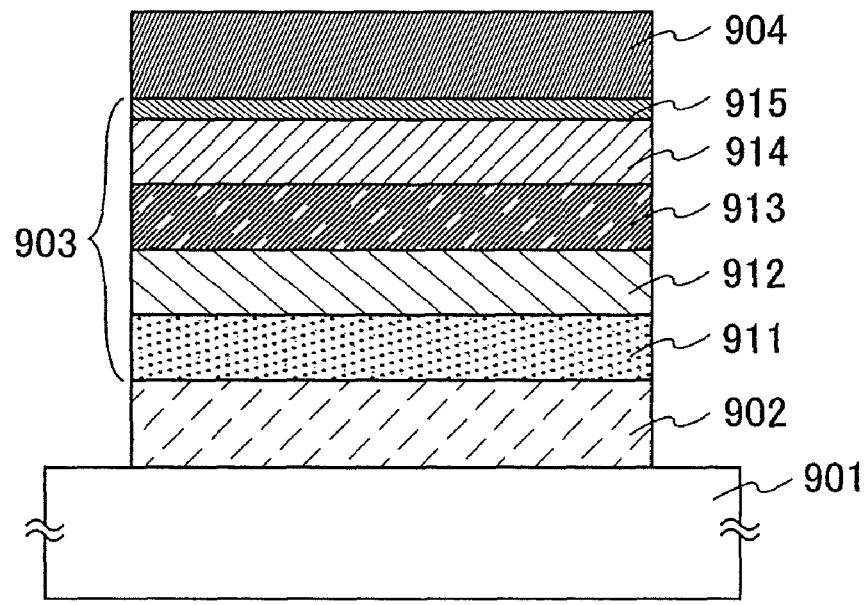

For example, light-emitting elements shown in FIGS. 9A and 9B can be manufactured. In the light-emitting element shown in FIG. 9A, a first electrode 902, an EL layer 903 which includes only a light-emitting layer 913, and a second electrode 904 are stacked in that order over a substrate 901. One of the first electrode 902 and the second electrode 904 functions as an anode, and the other functions as a cathode. Holes injected from an anode and electrons injected from a cathode are recombined in the EL layer 903, whereby light can be emitted. In this embodiment mode, the first electrode 902 functions as the anode and the second electrode 904 functions as the cathode.

In the light-emitting element shown in FIG. 9B, the EL layer 903 in FIG. 9A has a stacked structure including a plurality of layers. Specifically, a hole-injecting layer 911, a hole-transporting layer 912, the light-emitting layer 913, an electron-transporting layer 914, and an electron-injecting layer 915 are provided in that order from the first electrode 902 side. Note that the EL layer 903 functions by including at least the light-emitting layer 913 as in FIG. 9A; therefore, all of the above layers are not always necessary and may be selected as appropriate to be provided as needed.

As the substrate 901 in FIGS. 9A and 9B, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode 902 and the second electrode 904, any of various types of metals, alloys, electrically conductive compounds, mixtures thereof, and the like can be used. Specific examples are given below: indium tin oxide (ITO), indium tin oxide containing silicon or silicon oxide, indium zinc oxide (IZO), and indium oxide containing tungsten oxide and zinc oxide. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

A film of any of those materials is generally formed by sputtering. For example, a film of indium zinc oxide can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 to 5 wt % and 0.1 to 1 wt %, respectively. Further, a film of any of those materials may be formed by an ink-jet method, a spin coating method, or the like by application of a sol-gel process or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an ink-jet method or the like for the electrodes. The first electrode 902 and the second electrode 904 are not limited to a single-layer film and can be formed as a stacked-layer film.

Note that in order to extract light emitted from the EL layer 903 to the outside, one or both of the first electrode 902 and the second electrode 904 are formed so as to transmit light. For example, one or both of the first electrode 902 and the second electrode 904 are formed using a conductive material having a light-transmitting property, such as indium tin oxide, or formed using silver, aluminum, or the like with a thickness of several nanometers to several tens of nanometers. Alternatively, one or both of the first electrode 902 and the second electrode 904 can have a stacked-layer structure including a thin film of a metal such as silver, aluminum, or the like with a reduced thickness and a thin film of a conductive material having a light-transmitting property, such as ITO.

The EL layer 903 (the hole-injecting layer 911, the hole-transporting layer 912, the light-emitting layer 913, the electron-transporting layer 914, or the electron-injecting layer 915) of the light-emitting element of this embodiment mode can be formed by application of the deposition method described in Embodiment Mode 1. In addition, the electrode can also be formed by application of the deposition method described in Embodiment Mode 1.

For example, in the case where the light-emitting element shown in FIG. 9A is formed, a material layer of the evaporation donor substrate described in Embodiment Mode 1 is formed of a material which forms the EL layer 903 and the EL layer 903 is formed over the first electrode 902 over the substrate 901 using the evaporation donor substrate. Then, the second electrode 904 is formed over the EL layer 903, whereby the light-emitting element in FIG. 9A can be obtained.

Any of a variety of materials can be used for the light-emitting layer 913. For example, a fluorescent compound which exhibits fluorescence or a phosphorescent compound which exhibits phosphorescence can be used.

Examples of a phosphorescent compound which is used for the light-emitting layer 913 are given below. As a material for bluish light emission, bis[2-(4',6'-difluorophenyl)pyridinato-N,$C^{2'}$]iridium(III)tetrakis(1-pyrazolyl)borate (abbr.: FIr6), bis[2-(4',6'-difluorophenyl)pyridinato-N,$C^{2'}$]iridium(III)picolinate (abbr.: FIrpic), bis[2-(3',5'bistrifluoromethylphenyl)pyridinato-N,$C^{2'}$]iridium(III)picolinate (abbr.: Ir($CF_3$ppy)$_2$(pic)), bis[2-(4',6'-difluorophenyl)pyridinato-N,$C^{2'}$]iridium(III)acetylacetonate (abbr.: FIr(acac)) or the like can be given. As a material for greenish light emission, tris(2-phenylpyridinato-N,$C^{2'}$)iridium(III) (abbr.: Ir(ppy)$_3$), bis[2-phenylpyridinato-N,$C^{2'}$]iridium(III)acetylacetonate (abbr.: Ir(ppy)$_2$(acac)), bis(1,2-diphenyl-1H-benzimidazolato)iridium(III)acetylacetonate (abbr.: Ir(pbi)$_2$(acac)), bis(benzo[h]quinolinato)iridium(III)acetylacetonate (abbr.: Ir(bzq)$_2$(acac)) or the like can be given. As a material for yellowish light emission, bis(2,4-diphenyl-1,3-oxazolato-N,$C^{2'}$)iridium(III)acetylacetonate (abbr.: Ir(dpo)$_2$(acac)), bis[2-(4'-perfluorophenylphenyl)pyridinato]iridium(III)acetylacetonate (abbr.: Ir(p-PF-ph)$_2$(acac)), bis(2-phenylbenzothiazolato-N,$C^{2'}$)iridium(III)acetylacetonate (abbr.: Ir(bt)$_2$(acac)) or the like can be given. As a material for orangish light emission, tris(2-phenylquinolinato-N,$C^{2'}$)iridium(III) (abbr.: Ir(pq)$_3$), bis(2-phenylquinolinato-N,$C^{2'}$)iridium(III)acetylacetonate (abbr.: Ir(pq)$_2$(acac)) or the like can be given. As a material for reddish light emission, organometallic complex such as bis[2-(2'-benzo[4,5-α]thienyl)pyridinato-N,$C^{3'}$]iridium(III)acetylacetonate (abbr.: Ir(btp)$_2$(acac)), bis(1-phenylisoquinolinato-N,$C^{2'}$)iridium(III)acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$(acac)), or (2,3,7,8,12,13,17,18-octaethyl-21H,23H-porphyrinato)platinum(II) (abbr.: PtOEP) can be given. In addition, a rare earth metal complex such as tris(acetylacetonato)(monophenanthroline)terbium(III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer 913 are given below. As a material for bluish light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for greenish light emission, N-(9,10-diphenyl-2-anthryl)-N,9-diphenyl-9H-carbazol-3-amine (abbreviation, 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), N-[9,10-bis(1,1'-biphenyl-2-yl)]-N-[4-(9H-carbazol-9-yl)phenyl]-N-phenylanthracen-2-amine (abbr.: 2YGABPhA), N,N,9-triphenylanthracen-9-amine (abbr.: DPhAPhA), or the like can be given. As a material for yellowish light emission, rubrene, 5,12-bis(1,1'-biphenyl-4-yl)-6,11-diphenyltetracene (abbr.: BPT), or the like can be given.

As a material for reddish light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-α]fluoranthene-3,10-diamine (abbr.: p-mPhAFD), or the like can be given.

The light-emitting layer 913 may have a structure in which a substance having a high light-emitting property (dopant material) is dispersed in another substance (host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer 913 are given below: 4,4'-bis[N-(1-naphthyl)-N-phenylamino]biphenyl (abbr.: NPB), tris(8-quinolinolato)aluminum(III) (abbr.: Alq), 4,4'-bis[N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CzPA).

As the dopant material, any of the above-mentioned phosphorescent compounds and fluorescent compounds can be used.

When the light-emitting layer 913 has a structure in which a substance having a high light-emitting property (dopant material) is dispersed in another substance (host material), a mixed layer of a host material and a guest material is formed as the material layer over the evaporation donor substrate. Alternatively, the material layer over the evaporation donor substrate may have a structure in which a layer containing a host material and a layer containing a dopant material are stacked. By forming the light-emitting layer 913 using an evaporation donor substrate with the material layer having such a structure, the light-emitting layer 913 contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element shown in FIG. 9B is formed, the evaporation donor substrate described in Embodiment Mode 1 which has a material layer formed of a material for forming each layer in the EL layer 903 (the hole-injecting layer 911, the hole-transporting layer 912, the electron-transporting layer 914, and the electron-injecting layer 915) is prepared, and deposition of each layer is performed using a different evaporation donor substrate by the method described in Embodiment Mode 1, whereby the EL layer 903 is formed over the first electrode 902 over the substrate 901. Then, the second electrode 904 is formed over the EL layer 903, thus the light-emitting element in FIG. 9B can be formed. Note that although all the layers in the EL layer 903 can be formed by the method described in Embodiment Mode 1 in this case, only some of the layers in the EL layer 903 may be formed by the method described in Embodiment Mode 1.

For example, the hole-injecting layer 911 can be formed using molybdenum oxide, vanadium oxide, ruthenium oxide, tungsten oxide, manganese oxide, or the like. Alternatively, the hole-injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesufonate) (PEDOT/PSS), or the like.

As the hole-injecting layer 911, a layer which contains a substance having a high hole-transporting property and a substance having an electron-accepting property can be used. The layer which contains a substance having a high hole-transporting property and a substance having an electron-accepting property has high carrier density and an excellent hole-injecting property. When the layer which contains a substance having a high hole-transporting property and a substance having an electron-accepting property is used as a hole-injecting layer which is in contact with an electrode that functions as an anode, any of a variety of metals, alloys, electrically conductive compounds, mixtures thereof, and the like can be used for the electrode regardless of the magnitude of work function of a material of the electrode which functions as an anode.

The layer which contains a substance having a high hole-transporting property and a substance having an electron-accepting property can be formed using, for example, an evaporation donor substrate having a material layer which is a stack of a layer containing a substance having a high hole-transporting property and a layer containing a substance having an electron-accepting property.

Examples of the substance having an electron-accepting property which is used for the hole-injecting layer 911 are given below: 7,7,8,8-tetracyano-2,3,5,6-tetrafluoroquinodimethane (abbr.: $F_4$-TCNQ), chloranil, and the like. Other examples are transition metal oxides. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property used for the hole-injecting layer 911, any of various compounds such as an aromatic amine compound, a carbazole derivative, an aromatic hydrocarbon, and a high molecular compound (such as an oligomer, a dendrimer, and a polymer) can be used. Note that it is preferable that the substance having a high hole-transporting property used for the hole-injecting layer be a substance having a hole mobility of $10^{-6}$ cm$^2$/Vs or higher. Note that any other substance that has a hole-transporting property higher than an electron-transporting property may be used. Specific examples of the substance having a high hole-transporting property, which can be used for the hole-injecting layer 911, are given below.

Examples of an aromatic amine compound which can be used for the hole-injecting layer 911 are given below; 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Other examples are as follows: N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD), and 1,3,5-tris[N-(4-diphenylaminophenyl)-N-phenylamino]benzene (abbr.: DPA3B).

Specific examples of a carbazole derivative which can be used for the hole-injecting layer 911 are given below: 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), and 3-[N-(1-naphthyl)-N-(9-phenylcarbazol-3-yl)amino]-9-phenylcarbazole (abbr.: PCzPCN1).

Other examples of a carbazole derivative which can be used for the hole-injecting layer 911 are given below: 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), and 1,4-bis[4-(N-carbazolyl)phenyl]-2,3,5,6-tetraphenylbenzene.

Examples of an aromatic hydrocarbon which can be used for the hole-injecting layer 911 are given below: 2-tert-butyl-9,10-di(2-naphthyl)anthracene (abbr.: t-BuDNA), 2-tert-butyl-9,10-di(1-naphthyl)anthracene; 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As these aromatic hydrocarbons listed here, it is preferable that an aromatic hydrocarbon having a hole mobility of $1 \times 10^{-6}$ cm$^2$/Vs or more and having 14 to 42 carbon atoms be used.

Note that an aromatic hydrocarbon which can be used for the hole-injecting layer 911 may have a vinyl skeleton. Examples of an aromatic hydrocarbon having a vinyl group are given below: 4,4'-bis(2,2-diphenylvinyl)biphenyl (abbr.: DPVBi), and 9,10-bis[4-(2,2-diphenylvinyl)phenyl]anthracene (abbr.: DPVPA).

The hole-injecting layer 911 can be formed by using an evaporation donor substrate having a material layer which is a stack of a layer containing a substance having a high hole-transporting property and a layer containing a substance having an electron-accepting property. When metal oxide is used as the substance having an electron-accepting property, it is preferable that a layer which contains the metal oxide be formed after the layer which contains a substance having a high hole-transporting property be formed over the evaporation donor substrate. This is because, in many cases, metal oxide has a higher decomposition temperature or an evaporation temperature than a substance having a high hole-transporting property. The evaporation source with such a structure makes it possible to efficiently sublime a substance having a high hole-transporting property and metal oxide. In addition, local non-uniformity of the concentration in a film formed by evaporation can be suppressed. Further, there are few kinds of solvents which allow both a substance having a high hole-transporting property and metal oxide to be dissolved or dispersed therein, and a mixed solution is not easily formed; therefore, it is difficult to directly form a mixed layer by a wet method. However, the use of the deposition method of the present invention makes it possible to easily form a mixed layer which contains a substance having a high hole-transporting property and metal oxide.

In addition, the layer which contains a substance having a high hole-transporting property and a substance having an electron-accepting property is excellent in not only a hole-injecting property but also a hole-transporting property, and thus the above-described hole-injecting layer 911 may be used as the hole-transporting layer.

The hole-transporting layer 912 is a layer which contains a substance having a high hole-transporting property. Examples of the substance having a high hole-transporting property are given below: an aromatic amine compound such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB). Most of the substances mentioned here have a hole mobility of $10^{-6}$ cm$^2$/Vs or more. Note that any other material which has a hole-transporting property higher than an electron-transporting property may be used. The layer which contains a substance having a high hole-transporting property is not limited to a single layer and may be a stacked layer of two or more layers formed of the above-mentioned substances.

The electron-transporting layer 914 is a layer which contains a substance having a high electron-transporting property. Examples thereof are given below: metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), and bis(2-methyl-8-quinolinolato)(4-phenylphenolato)aluminum (abbr.: BAlq). Other examples are metal complexes having an oxazole-based ligand or a thiazole-based ligand, such as bis[2-(2-hydroxyphenyl)benzoxazolato]zinc (abbr.: Zn(BOX)$_2$), and bis[2-(2-hydroxyphenyl)benzothiazolato]zinc (abbr.: Zn(BTZ)$_2$). Besides metal complexes, other examples are given below: 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylbiphenyl)-1,2,4-triazole (abbr.: TAZ01), bathophenanthroline (abbr.: BPhen), and bathocuproine (abbr.: BCP). Most of the substances mentioned here have an electron mobility of $10^{-6}$ cm$^2$/Vs or higher. Note that any other material that has an electron-transporting property higher than a hole-transporting property may be used for the electron-transporting layer. The electron-transporting layer is not limited to a single layer and may be a stacked layer of two or more layers formed of the above-mentioned substances.

The electron-injecting layer 915 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode 904.

Note that there is no particular limitation on a stacked-layer structure of layers of the EL layer 903. The EL layer 903 may be formed by an appropriate combination of a light-emitting layer with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 903 is extracted to the outside through one or both of the first electrode 902 and the second electrode 904. Therefore, one or both of the first electrode 902 and the second electrode 904 are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 side through the second electrode 904. In the case where both the first electrode 902 and the second electrode 904 are electrodes having a light-transmitting property, light is extracted from both the substrate 901 side and the side opposite to the substrate 901 side through the first electrode 902 and the second electrode 904.

Note that, although FIGS. 9A and 9B show the structure in which the first electrode 902 functioning as an anode is provided on the substrate 901 side, the second electrode 904 functioning as a cathode may be provided on the substrate 901 side.

The EL layer 903 is formed by the deposition method described in Embodiment Mode 1 or may be formed by a combination of the deposition method described in Embodiment Mode 1 with another deposition method. A different film formation method may be used to form each electrode or each layer. Examples of a dry method are a vacuum evaporation method, an electron beam evaporation method, and a sputtering method. Examples of a wet method are an inkjet method, and a spin coating method.

In a light-emitting element of Embodiment Mode 5, an EL layer can be formed according to the present invention. Accordingly, a highly accurate film can be formed efficiency. Therefore, not only improvement in characteristics of the light-emitting element, but also improvement in yield and a reduction in cost can be achieved.

Embodiment Mode 6

Embodiment Mode 6 describes a light-emitting device which is formed using the light-emitting element described in Embodiment Mode 5.

First, a passive-matrix light-emitting device is described with reference to FIGS. 10A to 10C and FIG. 11.

In a passive-matrix (also called simple-matrix) light-emitting device, a plurality of anodes arranged in stripes (in strip form) are provided to be perpendicular to a plurality of cathodes arranged in stripes. A light-emitting layer is interposed at each intersection. Therefore, a pixel at an intersection of an anode which is selected (to which a voltage is applied) and a cathode which is selected emits light.

Figure 10A:
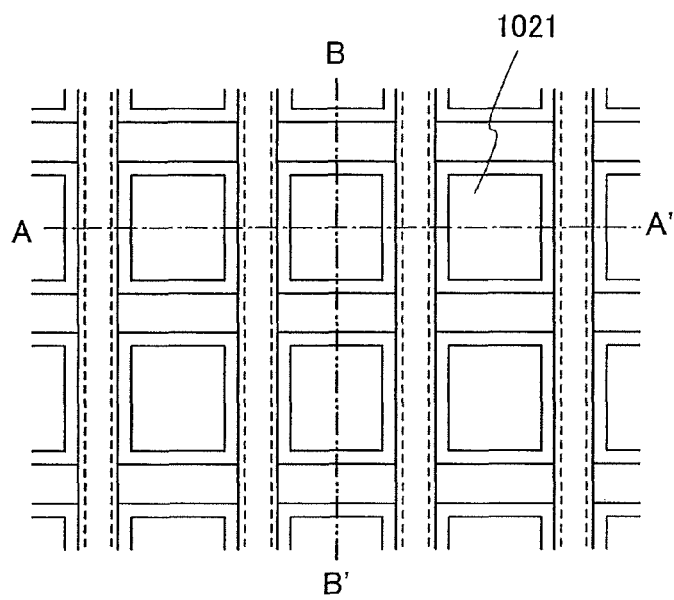
FIGS. 10A to 10C illustrate a passive-matrix light-emitting device.
Figure 10C:
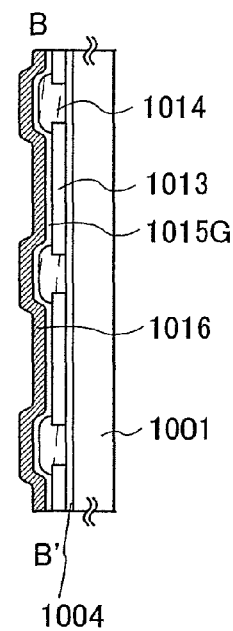
Figure 10B:
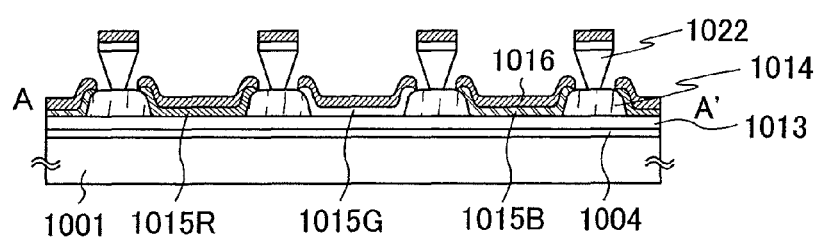

FIG. 10A shows a top view of a pixel portion before sealing. FIG. 10B shows a cross-sectional view taken along a dashed line A-A' in FIG. 10A. FIG. 10C shows a cross-sectional view taken along a dashed line B-B'.

Over a substrate 1001, an insulating layer 1004 is formed as a base insulating layer. Note that the base insulating layer is not necessarily provided if not necessary. A plurality of first electrodes 1013 are arranged in stripes at regular intervals over the insulating layer 1004. A partition wall 1014 having openings each corresponding to a pixel is provided over the first electrodes 1013. The partition wall 1014 having openings is formed using an insulating material (a photosensitive or nonphotosensitive organic material (polyimide, acrylic, polyamide, polyimide amide, or benzocyclobutene) or an SOG film (such as a $SiO_x$ film including an alkyl group)). Note that each opening corresponding to a pixel is a light-emitting region 1021.

Over the partition wall 1014 having openings, a plurality of inversely tapered partition walls 1022 which are parallel to each other are provided to intersect with the first electrodes 1013. The inversely tapered partition walls 1022 are formed by a photolithography method using a positive-type photosensitive resin, of which portion unexposed to light remains as a pattern, in which the amount of light exposure or the length of development time is adjusted so that a lower portion of a pattern is etched more.

The total thickness of the partition wall 1014 having openings and the inversely tapered partition wall 1022 is set to be larger than the total thickness of an EL layer and a second electrode 1016. Thus, an EL layer which is divided into plural regions, specifically, an EL layer (R) (1015R) formed of a material which exhibits red light emission, an EL layer (G) (1015G) formed of a material which exhibits green light emission, and an EL layer (B) (1015B) formed of a material which exhibits blue light emission; and the second electrode 1016 are formed. Note that the plurality of separated regions are electrically isolated from each other.

The second electrodes 1016 are electrodes in stripes which are parallel to each other and extended along a direction intersecting with the first electrodes 1013. Note that the EL layer and a part of a conductive layer forming the second electrode 1016 are also formed over the inversely tapered partition walls 1022; however, they are separated from the EL layer (R) (1015R), the EL layer (G) (1015G), the EL layer (B) (1015B), and the second electrodes 1016. Note that the EL layer in this embodiment mode is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (1015R), the EL layer (G) (1015G), and the EL layer (B) (1015B) are selectively formed to form a light-emitting device which provides three kinds of light emission (red (R), green (G), blue (B)) and is capable of performing full color display. The EL layer (R) (1015R), the EL layer (G) (1015G), and the EL layer (B) (1015B) are formed into stripes parallel to each other. These EL layers may be formed by the deposition method described in Embodiment Modes 1 and 2.

Furthermore, if necessary, sealing is performed using a sealant such as a sealant can or a glass substrate for sealing. Here, a glass substrate is used as a sealing substrate, and a substrate and the sealing substrate are attached to each other with an adhesive material such as a sealant to seal a space surrounded by the adhesive material such as a sealant. The space that is sealed is filled with a filler or a dry inert gas. In addition, a desiccant or the like may be put between the substrate and the sealant so that reliability of the light-emitting device is increased. A small amount of moisture is removed by the desiccant, whereby sufficient drying is performed. The desiccant may be a substance which absorbs moisture by chemical adsorption, such as oxide of an alkaline earth metal as typified by calcium oxide or barium oxide. Note that a substance which adsorbs moisture by physical adsorption such as zeolite or silica gel may alternatively be used.

Note that, if the sealant is provided covering and in contact with the light-emitting element to sufficiently block the outside air, the desiccant is not necessarily provided.

Figure 11:
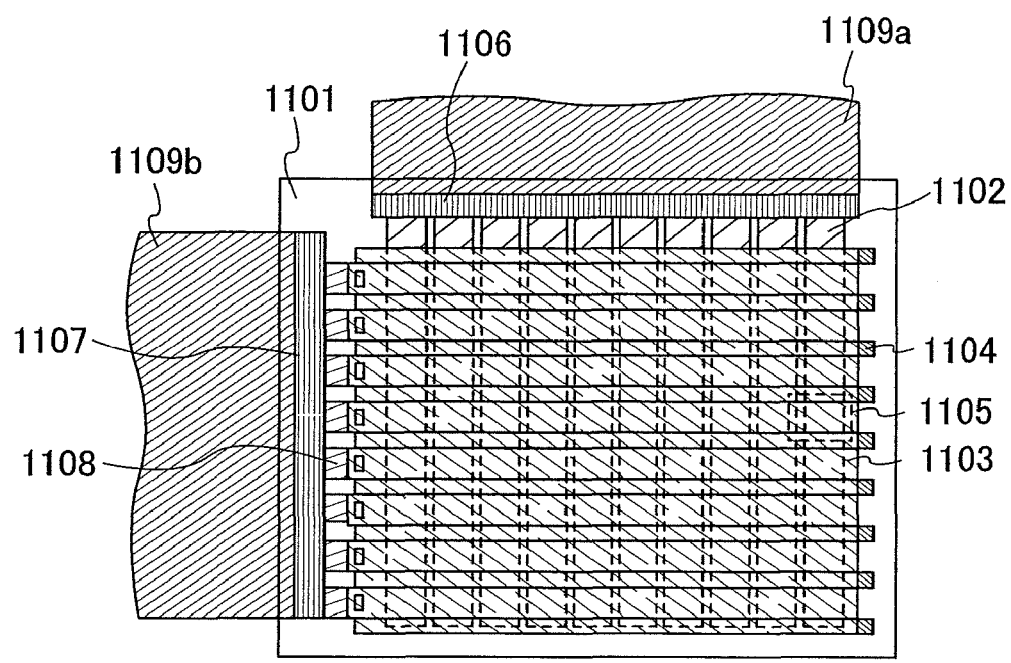
FIG. 11 illustrates a passive-matrix light-emitting device.

Next, FIG. 11 shows a top view of the case in which the passive-matrix light-emitting device in FIGS. 10A to 10C is mounted with an FPC or the like.

In FIG. 11, scan lines and data lines intersect with each other perpendicularly in a pixel portion for displaying images.

Here, the first electrodes 1013 in FIGS. 10A to 10C correspond to scan lines 1103 in FIG. 11; the second electrodes 1016 correspond to data lines 1102; and the inversely tapered partition walls 1022 correspond to partition walls 1104. EL layers are sandwiched between the data lines 1102 and the scan lines 1103, and an intersection portion indicated by a region 1105 corresponds to one pixel.

Note that the scan line 1103 is electrically connected at the end to a connection wiring 1108, and the connection wiring 1108 is connected to an FPC 1109b through an input terminal 1107. The data line 1102 is connected to an FPC 1109a through an input terminal 1106.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface. Further, the polarizing plate or the circularly polarizing plate may be provided with an anti-reflection film. For example, anti-glare treatment may be carried out by which reflected light can be diffused by surface roughness so as to reduce glare.

Although FIG. 11 shows the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element-forming substrate for mounting the IC. Each of the data line side IC and the scan line side IC may be formed using a silicon substrate. Alternatively, a driver circuit may be formed using TFTs over a glass substrate, a quartz substrate, or a plastic substrate. Although described here is an example in which a single IC is provided on one side, a plurality of ICs may be provided on one side.

Next, an example of an active-matrix light-emitting device is described with reference to FIGS. 12A and 12B. Note that FIG. 12A is a top view showing a light-emitting device and FIG. 12B is a cross-sectional view taken along a dashed line A-A' in FIG. 12A. The active-matrix light-emitting device of this embodiment mode includes a pixel portion 1202 provided over an element substrate 1210, a driver circuit portion (a source-side driver circuit) 1201, and a driver circuit portion (a gate-side driver circuit) 1203. The pixel portion 1202, the driver circuit portion 1201, and the driver circuit portion 1203 are sealed, with a sealant 1205, between the element substrate 1210 and a sealing substrate 1204.

In addition, over the element substrate 1210, a lead wiring 1208 for connecting an external input terminal, through which a signal (e.g., a video signal, a clock signal, a start signal, a reset signal, or the like) or an electric potential is transmitted to the driver circuit portion 1201 and the driver circuit portion 1203 is provided. Here, an example is described in which a flexible printed circuit (FPC) 1209 is provided as the external input terminal. Note that only the FPC is shown here; however, the FPC may be provided with a printed wiring board (PWB). The light-emitting device in this specification includes not only the light-emitting device itself, but also the light-emitting device with an FPC or a PWB attached thereto.

Then, a cross-sectional structure is described with reference to FIG. 12B. While the driver circuit portion and the pixel portion are provided over an element substrate 1210, FIG. 12B only shows the driver circuit portion 1201, which is the source side driver circuit portion, and the pixel portion 1202.

An example is shown in which a CMOS circuit which is a combination of an n-channel TFT 1223 and a p-channel TFT 1224 is formed as the driver circuit portion 1201. Note that a circuit included in the driver circuit portion may be formed using various CMOS circuits, PMOS circuits, or NMOS circuits. In this embodiment mode, a driver-integrated type in which a driver circuit is formed over a substrate is described; however, it is not necessarily required to have the structure, and a driver circuit can be formed not on but outside the substrate.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed covering an end portion of the first electrode 1213. In this embodiment mode, the insulator 1214 is formed using a positive photosensitive acrylic resin.

The insulator 1214 is preferably formed so as to have a curved surface with curvature at an upper end portion or a lower end portion in order to obtain favorable coverage by a film which is to be stacked over the insulator 1214. For example, in the case of using a positive photosensitive acrylic resin as a material for the insulator 1214, the insulator 1214 is preferably formed so as to have a curved surface with a curvature radius (0.2 µm to 3 µm) at the upper end portion thereof. Note that either a negative photosensitive material which becomes insoluble in an etchant by light irradiation or a positive photosensitive material which becomes soluble in an etchant by light irradiation can be used for the insulator 1214. As the insulator 1214, without limitation to an organic compound, either an organic compound or an inorganic compound such as silicon oxide or silicon oxynitride can be used.

An EL layer 1200 and a second electrode 1216 are stacked over the first electrode 1213. Note that when an ITO film is used as the first electrode 1213, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1212 which is connected to the first electrode 1213, resistance of the wiring is low and favorable ohmic contact with the ITO film can be obtained. Note that, although not shown, the second electrode 1216 is electrically connected to the FPC 1209, which is an external input terminal.

In the EL layer 1200, at least the light-emitting layer is provided, and in addition to the light-emitting layer, a hole-injecting layer, a hole-transporting layer, an electron-transporting layer, or an electron-injecting layer is provided as appropriate. The first electrode 1213, the EL layer 1200, and the second electrode 1216 are stacked, whereby a light-emitting element 1215 is formed.

Although the cross-sectional view in FIG. 12B shows only one light-emitting element 1215, a plurality of light-emitting elements are arranged in matrix in the pixel portion 1202. Light-emitting elements which provide three kinds of light emissions (R, G, and B) are formed in the pixel portion 1202, whereby a light-emitting device capable of full color display can be formed. Alternatively, a light-emitting device capable of full color display may be formed by a combination with color filters.

Furthermore, the sealing substrate 1204 and the element substrate 1210 are attached to each other with the sealant 1205, whereby the light-emitting element 1215 is provided in a space 1207 surrounded by the element substrate 1210, the sealing substrate 1204, and the sealant 1205. Note that the space 1207 may be filled with the sealant 1205 or with an inert gas (such as nitrogen or argon).

Note that an epoxy-based resin is preferably used as the sealant 1205. It is preferable that such a material transmit as little moisture and oxygen as possible. As the sealing substrate 1204, a plastic substrate formed of fiberglass-reinforced plastics (FRP), polyvinyl fluoride (PVF), polyester, acrylic, or the like can be used besides a glass substrate or a quartz substrate.

As described above, a light-emitting device can be obtained according to the present invention. An active-matrix light-emitting device tends to require high manufacturing cost per device because TFTs are manufactured; however, according to the present invention makes it possible to drastically reduce loss of materials in forming light-emitting elements. Thus, a reduction in manufacturing cost can be achieved.

According to the present invention, formation of an EL layer forming a light-emitting element can be facilitated as well as manufacture of a light-emitting device including the light-emitting element. In addition, it becomes possible to form a flat even film and a minute pattern; thus, a high-definition light-emitting device can be obtained. Further, a lamp heater or the like with large energy power can be used as a light source in film formation; accordingly, cycle time can be shortened, which can lead to a reduction in manufacturing cost.

Note that a structure in Embodiment Mode 6 can be combined with a structure in any of Embodiment Modes 1 to 5 as appropriate.

Embodiment Mode 7

This embodiment mode describes various electronic devices completed using the light-emitting device manufactured according to the present invention with reference to FIGS. 13A to 13E.

Examples of electronic devices manufactured using the light-emitting device according to the present invention include a television, a camera such as a video camera or a digital camera, a goggle type display (head mounted display), a navigation system, an audio reproducing device (such as a car audio and an audio component), a notebook computer, a game machine, a portable information terminal (such as a mobile computer, a cellular phone, a portable game machine, and an electronic book reader), an image reproducing device provided with a recording medium (specifically, a device for reproducing a recording medium such as a digital video disc (DVD) and having a display device for displaying the reproduced image), a lighting device, and the like. Specific examples of these electronic devices are shown in FIGS. 13A to 13E.

Figure 13A:
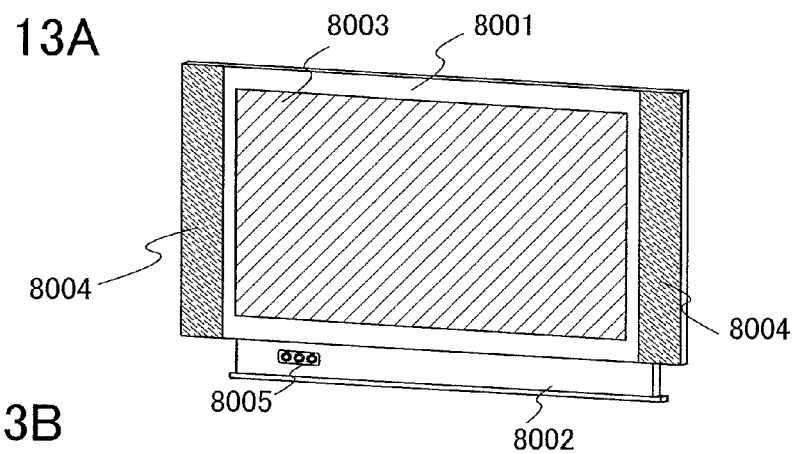
FIGS. 13A to 13E each illustrate electronic devices.

FIG. 13A shows a display device, which includes a chassis 8001, a support 8002, a display portion 8003, a speaker portion 8004, a video input terminal 8005, and the like. This display device is manufactured using a light-emitting device which is formed according to the present invention in the display portion 8003. Note that the display device includes all devices for displaying information such as for a personal computer, for receiving TV broadcasting, and for displaying an advertisement. According to the present invention, use efficiency of a material and manufacturing efficiency can be improved mainly in a deposition process of a light-emitting device. Accordingly, manufacturing cost can be reduced and productivity can be improved in manufacturing a display device; thus, an inexpensive display device can be provided.

Figure 13B:
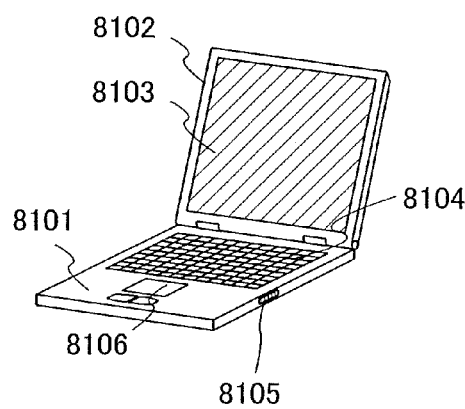

FIG. 13B shows a computer which includes a main body 8101, a chassis 8102, a display portion 8103, a keyboard 8104, an external connecting port 8105, a pointing device 8106, and the like. This computer is manufactured using a light-emitting device which is formed according to the present invention in the display portion 8103. According to the present invention, use efficiency of a material and manufacturing efficiency can be improved mainly in a deposition process of a light-emitting device can be improved. Accordingly, manufacturing cost can be reduced and productivity can be improved in manufacturing a computer; thus, an inexpensive computer can be provided.

Figure 13C:
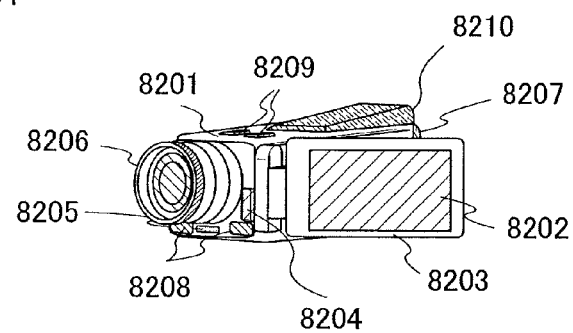

FIG. 13C shows a video camera which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. This video camera is manufactured using a light-emitting device which is formed according to the present invention in the display portion 8202. According to the present invention, use efficiency of a material and manufacturing efficiency can be improved mainly in a deposition process of a light-emitting device can be improved. Accordingly, manufacturing cost can be reduced and productivity can be improved in manufacturing a video camera; thus, an inexpensive video camera can be provided.

Figure 13D:
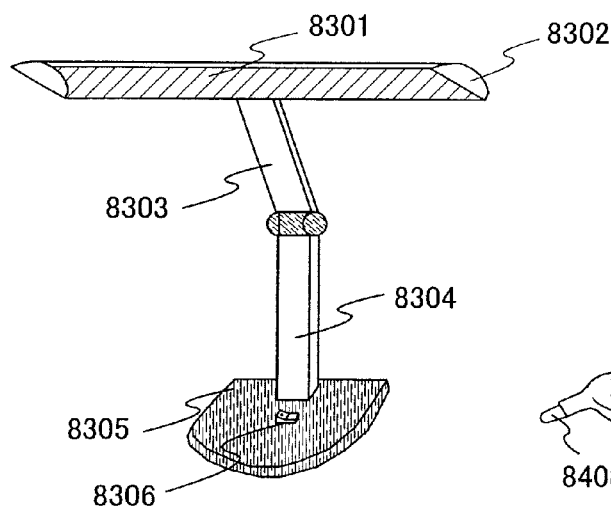

FIG. 13D shows a desk lamp which includes a lighting portion 8301, a shade 8302, an adjustable arm 8303, a support 8304, a base 8305, and a power supply switch 8306. This desk lamp is manufactured using a light-emitting device which is formed using the deposition apparatus of the present invention in the lighting portion 8301. Note that a lamp includes a ceiling light, a wall light, and the like in its category. According to the present invention, use efficiency of a material and manufacturing efficiency can be improved mainly in a deposition process of a light-emitting device can be improved. Accordingly, manufacturing cost can be reduced and productivity can be improved in manufacturing a desk lamp; thus, an inexpensive desk lamp can be provided.

Figure 13E:
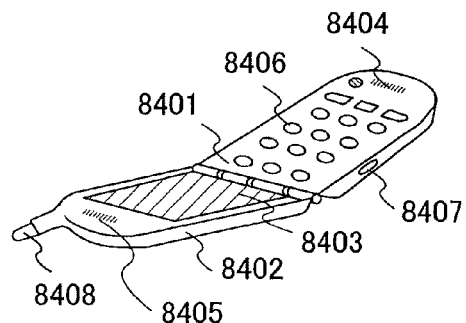

FIG. 13E shows a cellular phone which includes a main body 8401, a chassis 8402, a display portion 8403, an audio input portion 8404, an audio output power portion 8405, an operation key 8406, an external connecting port 8407, an antenna 8408, and the like. This cellular phone is manufactured using a light-emitting device which is formed using the deposition apparatus of the present invention in the lighting portion 8403. According to the present invention, use efficiency of a material and manufacturing efficiency can be improved mainly in a deposition process of a light-emitting device can be improved. Accordingly, manufacturing cost can be reduced and productivity can be improved in manufacturing a cellular phone; thus, an inexpensive cellular phone can be provided.

Figure 14A:
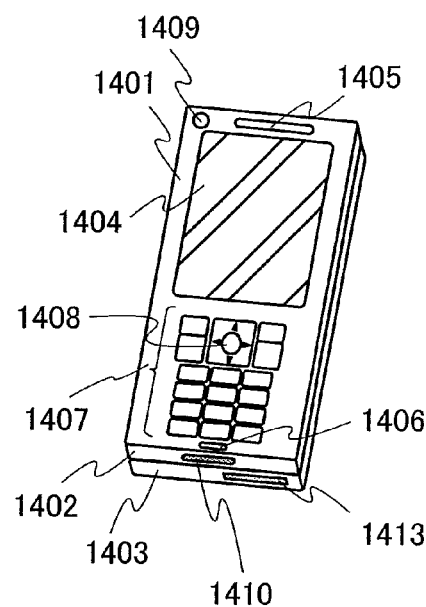
FIGS. 14A to 14C illustrate electronic devices.
Figure 14B:
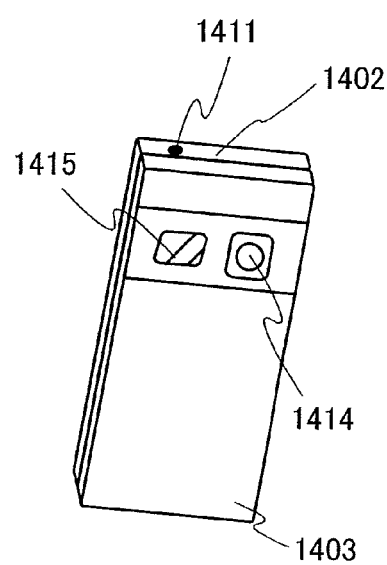
Figure 14C:
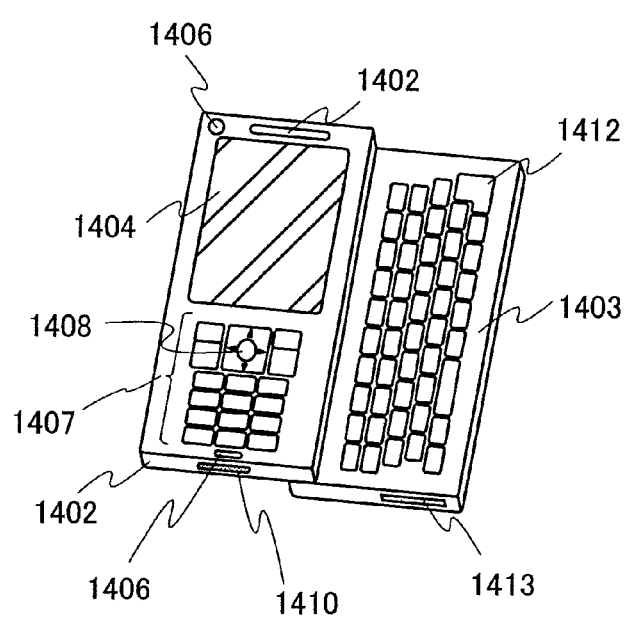

FIGS. 14A to 14C also show a cellular phone and FIG. 14A is a front view, FIG. 14B is a rear view, and FIG. 14C is a development view. A main body 1401 is a so-called smartphone which has both functions of a cellular phone and a portable information terminal, and incorporates a computer and can process a variety of data processing in addition to voice calls.

The main body 1401 has two chassis: a chassis 1402 and a chassis 1403. The chassis 1402 includes a display portion 1404, a speaker 1405, a microphone 1406, operation keys 1407, a pointing device 1408, a camera lens 1409, an external connection terminal 1410, an earphone terminal 1411, and the like, while the chassis 1403 includes a keyboard 1412, an external memory slot 1413, a camera lens 1414, a light 1415, and the like. In addition, an antenna is incorporated in the chassis 1402.

Further, in addition to the above-described structure, the smartphone may incorporate a non-contact IC chip, a small size memory device, or the like.

The light-emitting device described in the above embodiment modes can be incorporated in the display portion 1404, and a display orientation can be changed as appropriate according to a usage pattern. Because the camera lens 1409 is provided in the same plane as the display portion 1404, the smartphone can be used as a videophone. Further, a still image and a moving image can be taken with the camera lens 1414 and the light 1415 using the display portion 1404 as a viewfinder. The speaker 1405 and the microphone 1406 can be used for video calling, recording and playing sound, and the like without being limited to voice calls.

With operation keys 1407, making and receiving calls, inputting simple information such as e-mails or the like, scrolling the screen, moving the cursor, and the like are possible. Furthermore, the chassis 1402 and the chassis 1403 (FIG. 14A), which are overlapped with each other, are slid to expose the chassis 1403 as shown in FIG. 14C, and can be used as a portable information terminal. At this time, smooth operation can be conducted using the keyboard 1412 and the pointing device 1408. The external connection terminal 1410 can be connected to an AC adaptor and various types of cables such as a USB cable, and charging, data communication with a personal computer, or the like are possible. Furthermore, a large amount of data can be stored and moved by inserting a recording medium into the external memory slot 1413.

In addition to the above described functions, the smartphone may have an infrared communication function, a television receiver function, and the like.

Note that this cellular phone is manufactured using a light-emitting device which is formed according to the present invention in the display portion 1404. According to the present invention, use efficiency of a material and manufacturing efficiency can be improved mainly in a deposition process of a light-emitting device can be improved. Accordingly, manufacturing cost can be reduced and productivity can be improved in manufacturing a cellular phone; thus, an inexpensive cellular phone can be provided.

As described above, an electronic device or a lighting device can be obtained by using the light-emitting device according to the present invention. The range of application of the light-emitting device according to the present invention is so wide that the light-emitting device can be applied to electronic devices of various fields.

Note that a structure in Embodiment Mode 7 can be combined with a structure in any of Embodiment Modes 1 to 6 as appropriate.

Embodiment 1

Figure 15A:
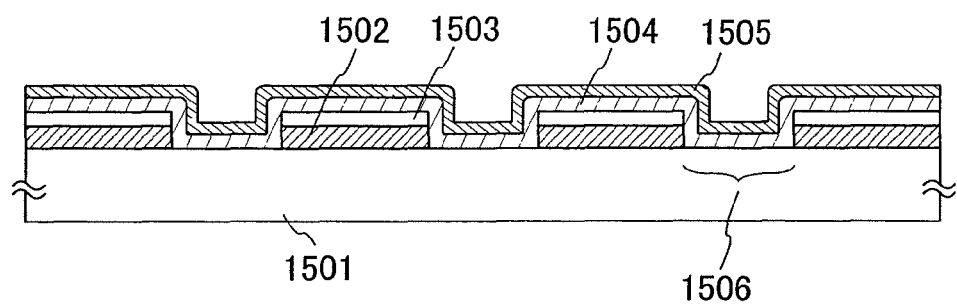
FIGS. 15A and 15B illustrate Embodiment 1.
Figure 15B:
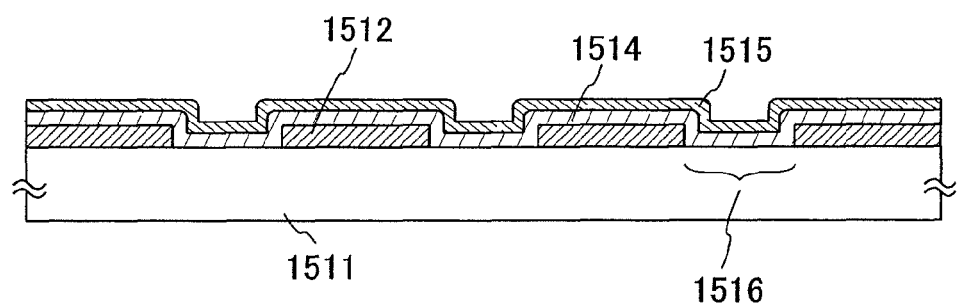

In this embodiment, accuracy of position of deposition using an evaporation donor substrate of the present invention is evaluated by measuring a sublimation region (a region from which the evaporation material is sublimated) of a material layer over the evaporation donor substrate after evaporation by light irradiation using the evaporation donor substrate which has a structure shown in FIGS. 15A and 15B.

An evaporation donor substrate shown in FIG. 15A is an evaporation donor substrate of the present invention in which the heat insulating layer 103 which is shown in FIGS. 1A to 1D in Embodiment Mode 1 is formed only over the reflective layer 102 (i.e., the heat insulating layer 103 is formed over positions which are overlapped with the reflective layer 102). Specifically, the evaporation donor substrate has a structure in which a reflective layer 1502 (aluminum: 300 nm), a heat insulating layer 1503 (titanium oxide: 200 nm), a light absorption layer 1504 (titanium: 200 nm), and a material layer 1505 (NPB: 50 nm) are stacked in that order over the substrate 1501 (a glass substrate).

An evaporation donor substrate having a structure shown in FIG. 15B, which is provided for comparison with FIG. 15A, has a structure in which the heat insulating layer 1503 is omitted in the evaporation donor substrate in FIG. 15A; specifically, a reflective layer 1512 (aluminum: 300 nm), a light absorption layer 1514 (titanium: 200 nm), and a material layer 1515 (NPB: 50 nm) are stacked in that order over the substrate 1511 (a glass substrate).

Note that an opening (the opening 1506 or 1516) formed in the reflective layer (the reflective layer 1502 or 1512) is 3 mm by 9 mm in either structure in FIG. 15A or 15B. In evaporation, infrared ray irradiation is performed for seven seconds.

As a result, a sublimation region of the material layer 1505 which is overlapped with the opening 1506 in the reflective layer 1502 of the evaporation donor substrate shown in FIG. 15A is 3 mm by 9 mm, which is the same as the shape of the opening 1506.

In contrast, a sublimation region of the material layer 1515 which is overlapped with the opening 1516 in the reflective layer 1512 of the evaporation donor substrate shown in FIG. 15B is 6 mm by 9 mm, which is larger than the opening 1516.

Accordingly, as shown in FIG. 15A, it is found that by providing the heat insulating layer 1503, a region of the light absorption layer 1504 which conducts heat to the material layer 1505 can be controlled; therefore, the sublimation region can be controlled. That is, by using an evaporation donor substrate provided with a heat insulating layer according to the present invention, control of an evaporation region can be improved and deposition onto a desired position can be performed accurately.

This application is based on Japanese Patent Application serial no. 2007-275083 filed with Japan Patent Office on Oct. 23, 2007, the entire contents of which are hereby incorporated by reference.

What is claimed is:

1. A method for manufacturing a light-emitting device comprising:
    disposing a first surface of a first substrate and a second substrate so as to face the first substrate and the second substrate, the first substrate being capable of transmitting light,
        wherein a reflective layer is formed on the first surface of the first substrate and includes an opening, and the reflective layer is capable of reflecting the light;
        wherein a heat insulating layer covers the opening and is in contact with an entire top surface and an entire side surface of the reflective layer, and is capable of transmitting the light;
        wherein a light absorption layer is formed on the heat insulating layer and covers the opening, and the light absorption layer is capable of absorbing the light,
        wherein a material layer is formed on the light absorption layer and covers the opening,
        wherein the reflective layer has a higher reflectance for the light than the light absorption layer,
        wherein the material layer contains either one or both of a light-emitting material and a carrier-transporting material, and
    irradiating a second surface opposite to the first surface of the first substrate with the light to heat and sublimate a part of the material layer which is overlapped with the opening and to evaporate the part of the material layer over the second substrate.

2. The method for manufacturing a light-emitting device according to claim 1,
    wherein the light is reflected by the reflective layer,
    wherein the light is transmitted through a part of the heat insulating layer which is overlapped with the opening, and
    wherein the light absorption layer absorbs the light which is transmitted through the heat insulating layer to heat and sublimate the material layer.

3. The method for manufacturing a light-emitting device, according to claim 1,
    wherein the reflective layer has a reflectance of 85% or more for the light.

4. The method for manufacturing a light-emitting device, according to claim 1,
    wherein the reflective layer contains a material selected from the group consisting of aluminum, silver, gold, platinum, copper, an alloy containing aluminum, an alloy containing silver, and indium tin oxide.

5. The method for manufacturing a light-emitting device, according to claim 1,
    wherein a thermal conductivity of the heat insulating layer is smaller than a thermal conductivity of the light absorption layer.

6. The method for manufacturing a light-emitting device, according to claim 1,
    wherein the heat insulating layer is configured to prevent heat in the reflective layer from being conducted to the light absorption layer.

7. The method for manufacturing a light-emitting device, according to claim 1,
    wherein the heat insulating layer has a transmittance of 60% or more.

8. The method for manufacturing a light-emitting device, according to claim 1,
    wherein the heat insulating layer has a thickness of 10 nm or more and 2 μm or less.

9. The method for manufacturing a light-emitting device, according to claim 1,
wherein the heat insulating layer contains a material selected from the group consisting of titanium oxide, silicon oxide, silicon nitride oxide, zirconium oxide, and silicon carbide.

10. The method for manufacturing a light-emitting device, according to claim 1,
wherein the light absorption layer has a reflectance of 70% or less for the light.

11. The method for manufacturing a light-emitting device, according to claim 1,
wherein the light absorption layer has a thickness of 100 nm or more and 600 nm or less.

12. The method for manufacturing a light-emitting device, according to claim 1,
wherein the light absorption layer contains a material selected from the group consisting of tantalum nitride, titanium, and carbon.

13. The method for manufacturing a light-emitting device, according to claim 1,
wherein the light absorption layer is formed into an island shape to be formed in a position overlapped with the opening of the reflective layer.

14. The method for manufacturing a light-emitting device, according to claim 1,
wherein the opening has a rectangular shape or a stripe shape.

15. A method for manufacturing a light-emitting device comprising:
disposing a first surface of a first substrate and a second substrate so as to face the first substrate and the second substrate, the first substrate being capable of transmitting light,
wherein a reflective layer is formed on the first surface of the first substrate and includes an opening, and the reflective layer is capable of reflecting the light;
wherein a heat insulating layer covers the opening and is in contact with an entire top surface and an entire side surface of the reflective layer, and is capable of transmitting the light;
wherein a light absorption layer is formed on the heat insulating layer and covers the opening, and the light absorption layer is capable of absorbing the light,
wherein a material layer is formed on the light absorption layer and covers the opening,
wherein the reflective layer has a higher reflectance for the light than the light absorption layer,
wherein the material layer contains either one or both of a light-emitting material and a carrier-transporting material, and
irradiating a second surface opposite to the first surface of the first substrate with the light to heat and sublimate a part of the material layer which is overlapped with the opening and to evaporate the part of the material layer over the second substrate,
wherein the irradiating step is performed in a reduced-pressure atmosphere.

16. The method for manufacturing a light-emitting device according to claim 15,
wherein the light is reflected by the reflective layer,
wherein the light is transmitted through a part of the heat insulating layer which is overlapped with the opening, and
wherein the light absorption layer absorbs the light which is transmitted through the heat insulating layer to heat and sublimate the material layer.

17. The method for manufacturing a light-emitting device, according to claim 15,
wherein the reflective layer has a reflectance of 85% or more for the light.

18. The method for manufacturing a light-emitting device, according to claim 15,
wherein the reflective layer contains a material selected from the group consisting of aluminum, silver, gold, platinum, copper, an alloy containing aluminum, an alloy containing silver, and indium tin oxide.

19. The method for manufacturing a light-emitting device, according to claim 15,
wherein a thermal conductivity of the heat insulating layer is smaller than a thermal conductivity of the light absorption layer.

20. The method for manufacturing a light-emitting device, according to claim 15,
wherein the heat insulating layer is configured to prevent heat in the reflective layer from being conducted to the light absorption layer.

21. The method for manufacturing a light-emitting device, according to claim 15,
wherein the heat insulating layer has a transmittance of 60% or more.

22. The method for manufacturing a light-emitting device, according to claim 15,
wherein the heat insulating layer has a thickness of 10 nm or more and 2 µm or less.

23. The method for manufacturing a light-emitting device, according to claim 15,
wherein the heat insulating layer contains a material selected from the group consisting of titanium oxide, silicon oxide, silicon nitride oxide, zirconium oxide, and silicon carbide.

24. The method for manufacturing a light-emitting device, according claim 15,
wherein the light absorption layer has a reflectance of 70% or less for the light.

25. The method for manufacturing a light-emitting device, according to claim 15,
wherein the light absorption layer has a thickness of 100 nm or more and 600 nm or less.

26. The method for manufacturing a light-emitting device, according to claim 15,
wherein the light absorption layer contains a material selected from the group consisting of tantalum nitride, titanium, and carbon.

27. The method for manufacturing a light-emitting device, according to claim 15,
wherein the light absorption layer is formed into an island shape to be formed in a position overlapped with the opening of the reflective layer.

28. The method for manufacturing a light-emitting device, according to claim 15,
wherein the opening has a rectangular shape or a stripe shape.

* * * * *